United States Patent
Kumar et al.

(10) Patent No.: US 11,271,010 B2
(45) Date of Patent: Mar. 8, 2022

(54) MULTI VERSION LIBRARY CELL HANDLING AND INTEGRATED CIRCUIT STRUCTURES FABRICATED THEREFROM

(71) Applicant: Intel Corporation, Santa Clara, CA (US)

(72) Inventors: Ranjith Kumar, Beaverton, OR (US); Quan Shi, Beaverton, OR (US); Mark T. Bohr, Aloha, OR (US); Andrew W. Yeoh, Portland, OR (US); Sourav Chakravarty, Portland, OR (US); Barbara A. Chappell, Portland, OR (US); M. Clair Webb, North Logan, UT (US)

(73) Assignee: Intel Corporation, Santa Clara, CA (US)

( * ) Notice: Subject to any disclaimer, the term of this patent is extended or adjusted under 35 U.S.C. 154(b) by 127 days.

(21) Appl. No.: 16/629,802

(22) PCT Filed: Sep. 20, 2017

(86) PCT No.: PCT/US2017/052584
§ 371 (c)(1),
(2) Date: Jan. 9, 2020

(87) PCT Pub. No.: WO2019/059907
PCT Pub. Date: Mar. 28, 2019

(65) Prior Publication Data
US 2020/0357823 A1   Nov. 12, 2020

(51) Int. Cl.
*H01L 27/118* (2006.01)
*G06F 30/392* (2020.01)
(Continued)

(52) U.S. Cl.
CPC ...... *H01L 27/11807* (2013.01); *G06F 30/392* (2020.01); *H01L 27/0207* (2013.01); *H01L 27/0924* (2013.01); *H01L 2027/11875* (2013.01)

(58) Field of Classification Search
CPC ........ H01L 27/0207–0296; H01L 2027/11874; H01L 2027/11875; G06F 30/39; G06F 30/392
See application file for complete search history.

(56) References Cited

U.S. PATENT DOCUMENTS 5,349,659 A * 9/1994 Do ................... G06F 30/327
716/132
6,160,275 A * 12/2000 Nishio .............. H01L 27/11807
257/206

(Continued)

OTHER PUBLICATIONS

Search Report for European Patent Application No. 17925686.2, dated Jun. 17, 2021, 12 pages.
(Continued)

*Primary Examiner* — Scott B Geyer
(74) *Attorney, Agent, or Firm* — Schwabe, Williamson & Wyatt, P.C.

(57) ABSTRACT

Multi version library cell handling and integrated circuit structures fabricated therefrom are described. In an example, an integrated circuit structure includes a plurality of gate lines parallel along a first direction of a substrate and having a pitch along a second direction orthogonal to the first direction. A first version of a cell type is over a first portion of the plurality of gate lines, the first version of the cell type including a first plurality of interconnect lines having a second pitch along the second direction, the second pitch less than the first pitch.

7 Claims, 15 Drawing Sheets

(51) Int. Cl.
  *H01L 27/02* (2006.01)
  *H01L 27/092* (2006.01)

(56) References Cited

U.S. PATENT DOCUMENTS

| | | | | |
|---|---|---|---|---|
| 6,574,786 B1* | 6/2003 | Pohlenz | ................. | G06F 30/39 |
| | | | | 716/112 |
| 6,892,370 B2* | 5/2005 | Flohr | ..................... | G06F 30/39 |
| | | | | 716/126 |
| 7,055,121 B1* | 5/2006 | Bolander | ............. | G06F 30/327 |
| | | | | 716/113 |
| 7,126,837 B1 | 10/2006 | Banachowicz | | |
| 8,739,104 B1* | 5/2014 | Penzes | ............. | H01L 27/11807 |
| | | | | 716/122 |
| 9,595,536 B1* | 3/2017 | Haigh | ................. | H01L 23/5226 |
| 2004/0143797 A1* | 7/2004 | Nguyen | ................. | G06F 30/30 |
| | | | | 716/122 |
| 2006/0098469 A1* | 5/2006 | Yang | ...................... | H01L 27/11 |
| | | | | 365/63 |
| 2006/0289861 A1* | 12/2006 | Correale | .......... | H01L 27/11807 |
| | | | | 257/48 |
| 2007/0011643 A1* | 1/2007 | Wang | ..................... | G06F 30/30 |
| | | | | 716/105 |
| 2009/0037864 A1* | 2/2009 | Becker | ................... | G06F 30/39 |
| | | | | 716/119 |
| 2009/0271753 A1 | 10/2009 | Quandt et al. | | |
| 2011/0157989 A1* | 6/2011 | Iwata | ..................... | G11C 16/30 |
| | | | | 365/185.17 |
| 2012/0241986 A1* | 9/2012 | Sherlekar | .......... | H01L 27/11807 |
| | | | | 257/784 |
| 2014/0175565 A1 | 6/2014 | Smayling et al. | | |
| 2014/0203378 A1 | 7/2014 | Ou et al. | | |
| 2015/0084129 A1* | 3/2015 | Lee | ..................... | H01L 27/0207 |
| | | | | 257/347 |
| 2015/0357282 A1* | 12/2015 | Lau | ..................... | H01L 23/5226 |
| | | | | 257/401 |
| 2015/0370950 A1* | 12/2015 | Kawa | ............... | H01L 21/823871 |
| | | | | 716/119 |
| 2016/0147926 A1 | 5/2016 | Chiang et al. | | |
| 2017/0039312 A1* | 2/2017 | Fukaya | ................. | G06F 30/394 |
| 2017/0194329 A1 | 7/2017 | Iwahori | | |
| 2017/0352650 A1* | 12/2017 | Azmat | ............... | H01L 23/5226 |
| 2018/0342462 A1* | 11/2018 | Kuchanuri | ........ | H01L 27/11807 |

OTHER PUBLICATIONS

Search Report for European Patent Application No. 17925686.2, dated Mar. 16, 2021, 13 pgs.
International Preliminary Report on Patentability for International Patent Application No. PCT/US2017/052584, dated Apr. 2, 2020, 9 pgs.
International Search Report and Written Opinion for International Patent Application No. PCT/US2017/052584 dated Jun. 20, 2018, 19 pgs.

* cited by examiner

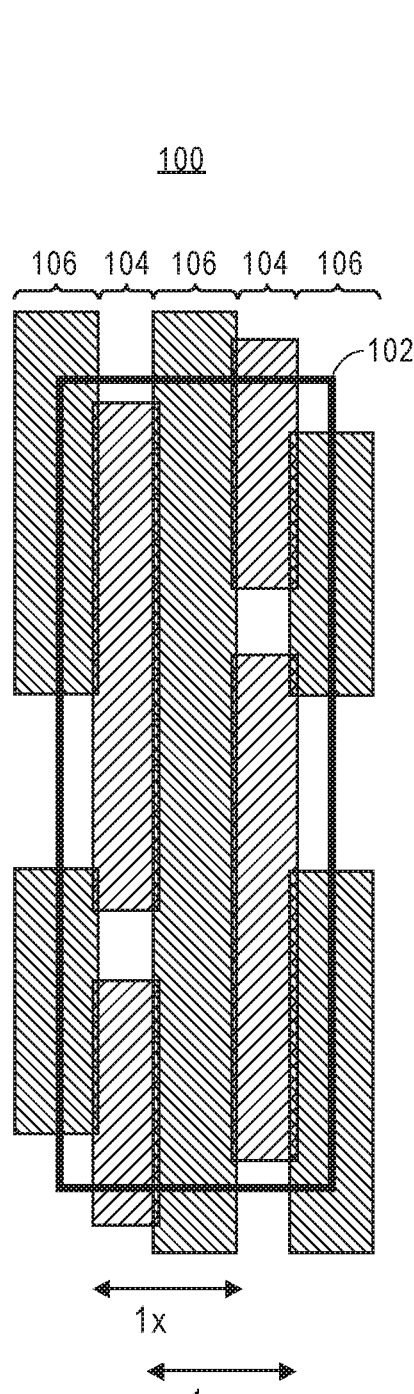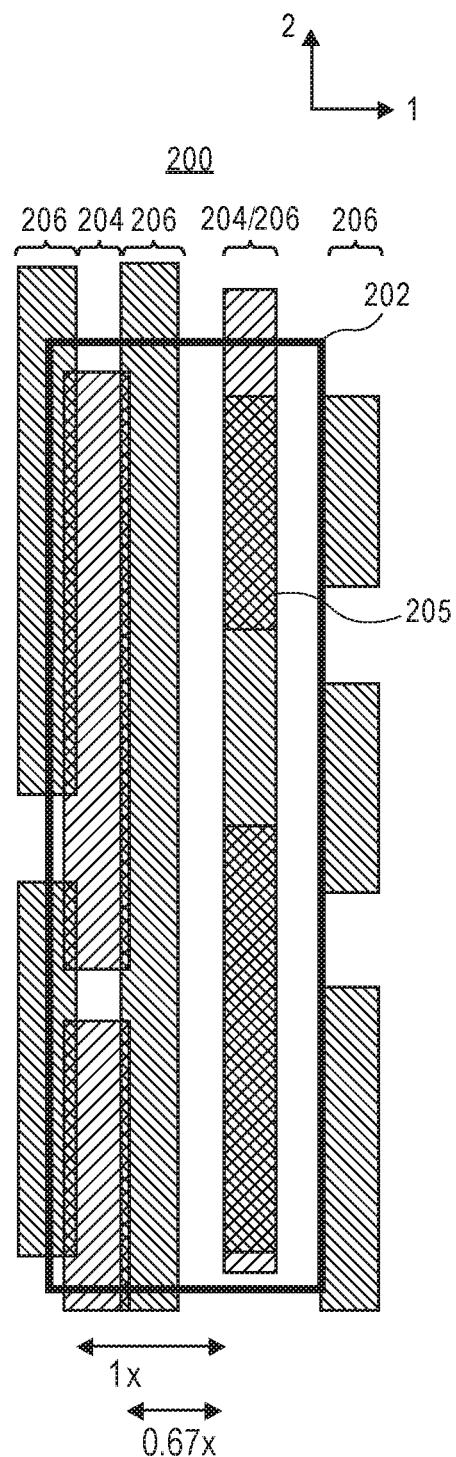
FIG. 1
(PRIOR ART)
FIG. 2

MULTI VERSION LIBRARY CELL HANDLING AND INTEGRATED CIRCUIT STRUCTURES FABRICATED THEREFROM

CROSS-REFERENCE TO RELATED APPLICATION

This patent application is a U.S. National Phase Application under 35 U.S.C. § 371 of International Application No. PCT/US2017/052584, filed Sep. 20, 2017, entitled "MULTI VERSION LIBRARY CELL HANDLING AND INTEGRATED CIRCUIT STRUCTURES FABRICATED THEREFROM," which designates the United States of America, the entire disclosure of which is hereby incorporated by reference in its entirety and for all purposes.

TECHNICAL FIELD

Embodiments of the disclosure are in the field of integrated circuit structures and, in particular, multi version library cell handling.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips.

For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant. In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and compatibility with the existing high-yielding bulk silicon substrate infrastructure. Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

Variability in conventional and state-of-the-art fabrication processes may limit the possibility to further extend them into the, e.g. 10 nm or sub-10 nm range. Consequently, fabrication of the functional components needed for future technology nodes may require the introduction of new methodologies or the integration of new technologies in current fabrication processes or in place of current fabrication processes. New layouts may be introduced either to accommodate or to enable such future technology nodes.

BRIEF DESCRIPTION OF THE DRAWINGS

FIG. 1 illustrates a first view of a conventional cell layout for a memory cell.

FIG. 2 illustrates a first view of a cell layout for a memory cell having an increased metal 1 pitch density relative to underlying gate lines, in accordance with an embodiment of the present disclosure.

DESCRIPTION OF THE EMBODIMENTS

Figure 3B:
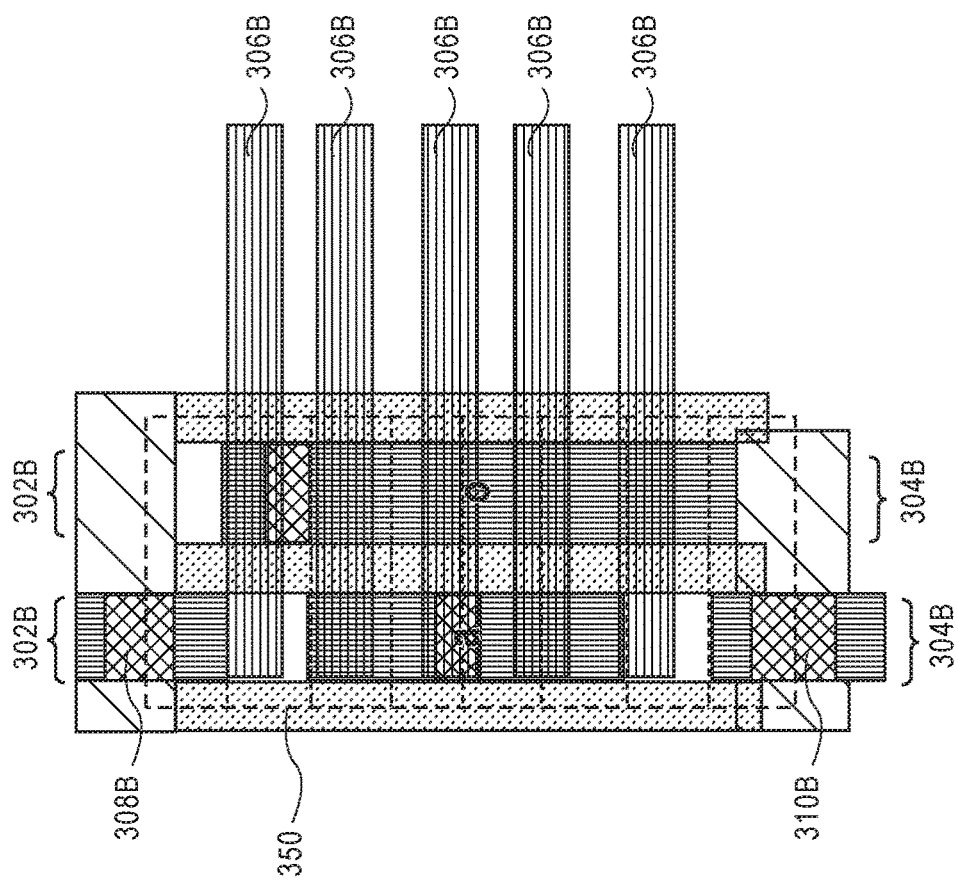
FIG. 3B illustrates a plan view showing conventional pin hits for a plurality of metal 2 (M2) lines in a layout having metal 1 (M1) with the same density relative to underlying gate lines.

Multi version library cell handling and integrated circuit structures fabricated therefrom are described. In the following description, numerous specific details are set forth, such as specific layout or material regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to multi version library cell handling when parallel interconnect lines (e.g., Metal 1 lines) and gate lines are misaligned. Embodiments may be directed to 10 nanometer or smaller technology nodes. Embodiments may include or be directed to cell layouts that make possible higher performance cells in a same or smaller footprint relative to a previous technology node. In an embodiment, interconnect lines overlying gate lines are fabricated to have an increased density relative to the underlying gate lines. Such an embodiment may enable an increase in pin hits, increased routing possibilities, or increased access to cell pins. Embodiments may be implemented to provide greater than 6% block level density.

To provide context, gate lines and the next parallel level of interconnects (typically referred to as metal 1, with a metal 0 layer running orthogonal between metal 1 and the gate lines) need to be in alignment at the block level. However, in an embodiment, the pitch of the metal 1 lines is made different, e.g., smaller, than the pitch of the gate lines. Two standard cell versions (e.g., two different cell patterns) for each cell are made available to accommodate the difference in pitch. The particular version selected follows a rule placement adhering at the block level. If not selected properly, dirty registration (DR) may occur. In accordance with an embodiment of the present disclosure, a higher metal layer (e.g., metal 1 or M1) with increased pitch density relative to the underlying gate lines is implemented. In an embodiment, such an approach enables aggressive scaling to provide improved cost per transistor for, e.g., a 10 nanometer (10 nm) technology node.

As a comparative example, FIG. 1 illustrates a first view of a conventional cell layout for a memory cell.

Referring to FIG. 1, an exemplary 14 nanometer (14 nm) layout 100 includes a bit cell 102. Bit cell 102 includes gate or poly lines 104 and metal 1 (M1) lines 106. In the example shown, the poly lines 104 have a 1× pitch, and the M1 lines 106 have a 1× pitch. In a particular embodiment, the poly lines 104 have 70 nm pitch, and the M1 lines 106 have a 70 nm pitch.

In contrast to FIG. 1, FIG. 2 illustrates a first view of a cell layout for a memory cell having an increased metal 1 pitch density relative to underlying gate lines, in accordance with an embodiment of the present disclosure.

Referring to FIG. 2, an exemplary 10 nanometer (10 nm) layout 200 includes a bit cell 202. Bit cell 202 includes gate or poly lines 204 and metal 1 (M1) lines 206. In the example shown, the poly lines 204 have 1× pitch, and the M1 lines 206 have a 0.67× pitch. The result is an overlapping line 205, which includes a M1 line directly over a poly line. In a particular embodiment, the poly lines 204 have 54 nm pitch, and the M1 lines 206 have a 36 nm pitch.

In comparison to layout 100, in layout 200, the M1 pitch is less than the gate pitch, freeing up an extra line (205) every third line (e.g., for every two poly lines, there are three M1 lines). In an embodiment, contact to poly is achieved through a contact over active gate (COAG) arrangement.

Referring more generally to FIG. 2, in an embodiment, an integrated circuit structure includes a memory bit cell 202 on a substrate. The memory bit cell 202 includes first and second gate lines 204 parallel along a second direction 2 of the substrate. The first and second gate lines 202 have a first pitch along a first direction (1) of the substrate, the first direction (1) perpendicular to the second direction (2). First, second and third interconnect lines 206 are over the first and second gate lines 204. The first, second and third interconnect lines 206 are parallel along the second direction (2) of the substrate. The first, second and third interconnect lines 206 have a second pitch along the first direction, where the second pitch is less than the first pitch.

As is applicable throughout the present disclosure, the gate lines 204 may be referred to as being on tracks to form a grating structure. The interconnect lines 206 may also be referred to as being on tracks to form a grating structure. In an embodiment, the term "grating" for gate lines or interconnect lines is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have gate lines or interconnect lines spaced at a constant pitch and having a constant width. The pattern may be fabricated by a pitch halving or pitch quartering, or other pitch division, approach.

In an embodiment, increased pin hits are achieved by increasing the density of the first level of interconnect lines relative to underlying gate lines that run parallel to the interconnect lines. FIG. 3A illustrates a plan view showing increased pin hits for a plurality of metal 2 (M2) lines in a layout having metal 1 (M1) with increased density relative to underlying gate lines, in accordance with an embodiment of the present disclosure.

Referring to FIG. 3A, three gate lines 302A (otherwise known as poly lines) are shown. Four metal 1 (M1) lines 304A run parallel with the gate lines 302A. Although not shown, metal 0 (M0) lines may run orthogonal between the gate lines 302A and the metal 1 (M1) lines 304A. Overlying metal 2 (M2) lines 306A are shown running orthogonal to the underlying M1 lines 304A. In a particular embodiment, VCC 308A and VSS 310A are shown. Pins are designated as 'a' and 'o'. Five M2 tracks 306A access pin a, and five M2 tracks 306A access pin o.

Figure 3A:
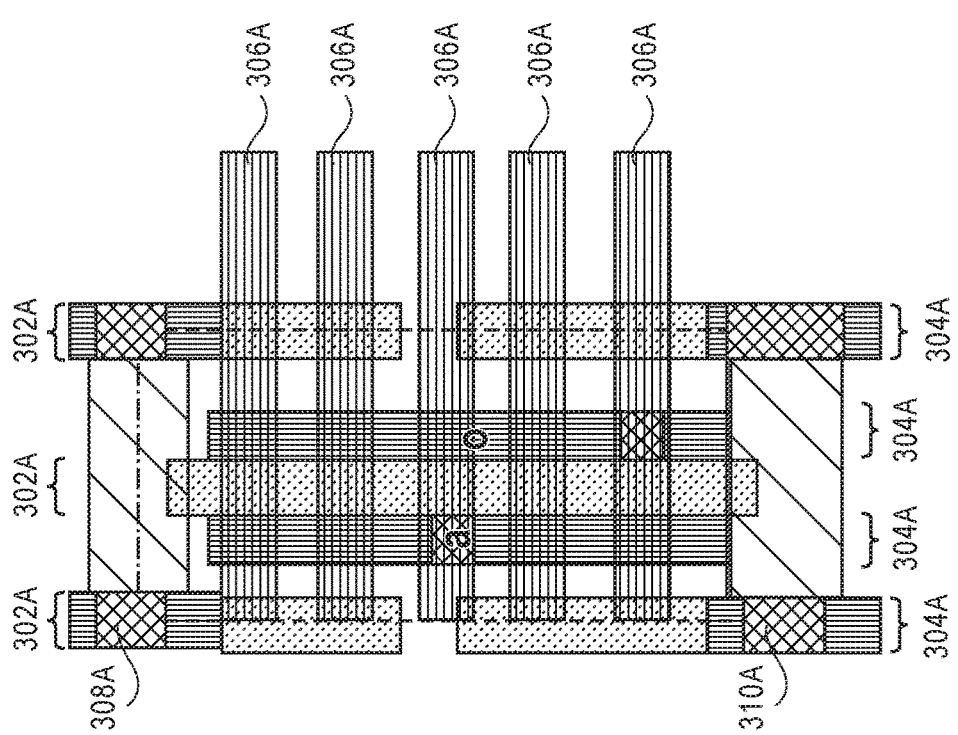
FIG. 3A illustrates a plan view showing increased pin hits for a plurality of metal 2 (M2) lines in a layout having metal 1 (M1) with increased density relative to underlying gate lines, in accordance with an embodiment of the present disclosure.

In contrast to FIG. 3A, FIG. 3B illustrates a plan view showing conventional pin hits for a plurality of metal 2 (M2) lines in a layout having metal 1 (M1) with the same density relative to underlying gate lines.

Referring to FIG. 3B, two gate lines 302B (otherwise known as poly lines) are shown. Two metal 1 (M1) lines 304B run parallel with the gate lines 302B. Although not shown, metal 0 (M0) lines may run orthogonal between the gate lines 302B and the metal 1 (M1) lines 304B. Overlying metal 2 (M2) lines 306B are shown running orthogonal to the underlying M1 lines 304B. In a particular embodiment, VCC 308B and VSS 310B are shown. Pins are designated as 'a' and 'o'. Five M2 tracks 306B access pin o, but only three M2 tracks 306B access pin a. At location 350, pin access is blocked due to the presence of a power connection.

Embodiments described herein provide an approach for handling cells where gate lines and metal 1 lines are misaligned. In an embodiment, two versions of each standard cell are made available for each cell, with targeted block level placements. In an embodiment, there are no restrictions to layout since appropriate selection between the two versions permits the situations that any cell can be placed in any location.

Figure 4:
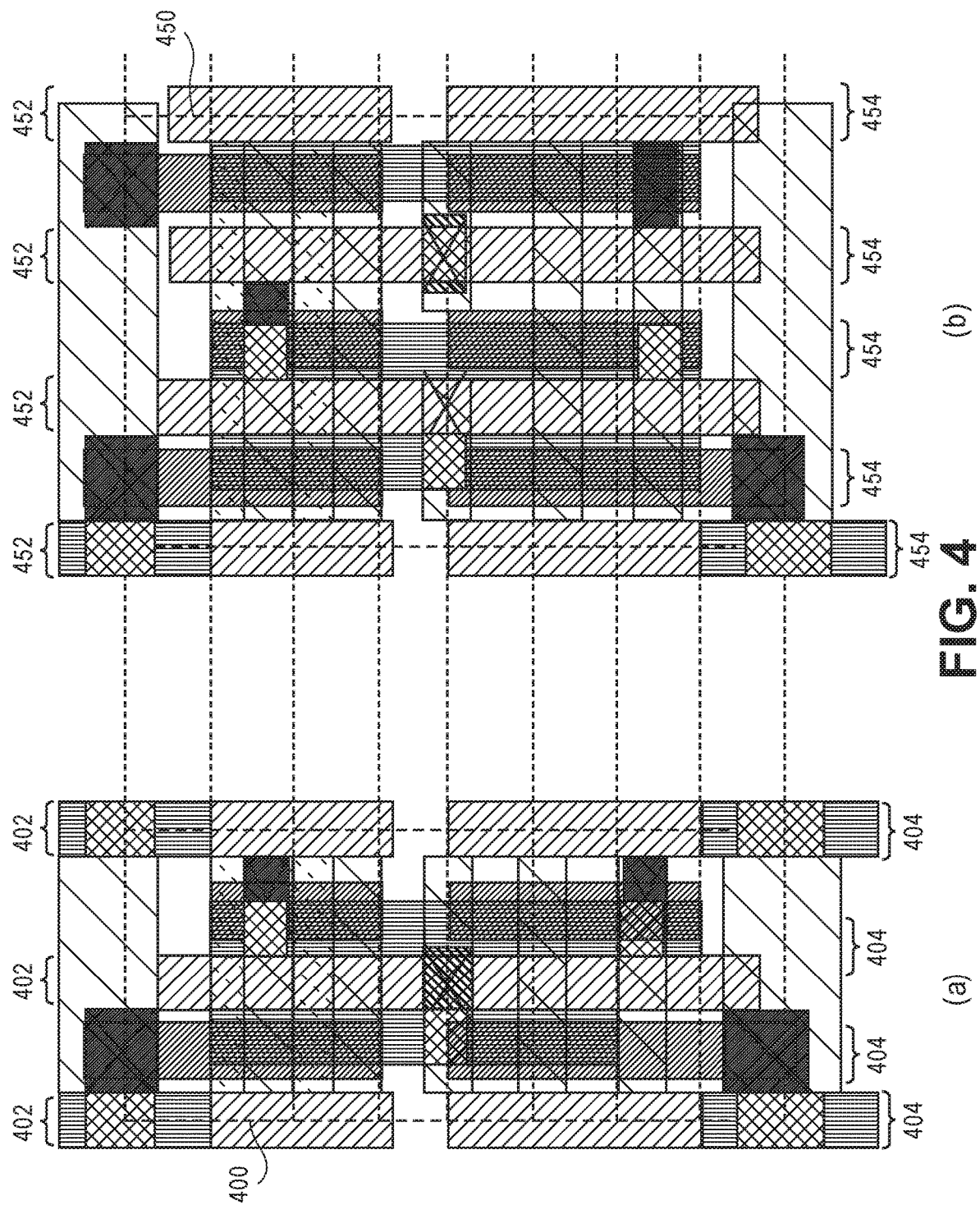
FIG. 4 illustrates plan views of (a) an inverter cell having even poly pitch relative to (b) a NAND cell having odd poly pitch, in accordance with an embodiment of the present disclosure.

As a first standard cell example, FIG. 4 illustrates plan views of (a) an inverter cell having even poly pitch relative to a NAND cell having odd poly pitch, in accordance with an embodiment of the present disclosure. Referring to part (a) of FIG. 4, a cell 400 (dashed box) includes gate lines 402. Metal 1 lines 404 are shown overlying gate lines 402, with one additional M1 line 404 per three gate lines 402. M1 lines are at both the left and right sides of the cell border 400. Referring to part (b) of FIG. 4, a cell 450 (dashed box) includes gate lines 452. Metal 1 lines 454 are shown overlying gate lines 452, with one additional M1 line 454 per two gate lines 452. A M1 line is at the left side of cell border 450, but not at the right side of cell border 450. As a result of the layouts, in a scenario where a first inverter is adjacent a NAND cell 450 which is adjacent a second inverter (as taken from left to right), a dirty registration (DR) occurs between the NAND cell 450 and the second inverter since metal 1 lines may be touching where the NAND cell and the second inverter are abutting to one another.

Figure 5:
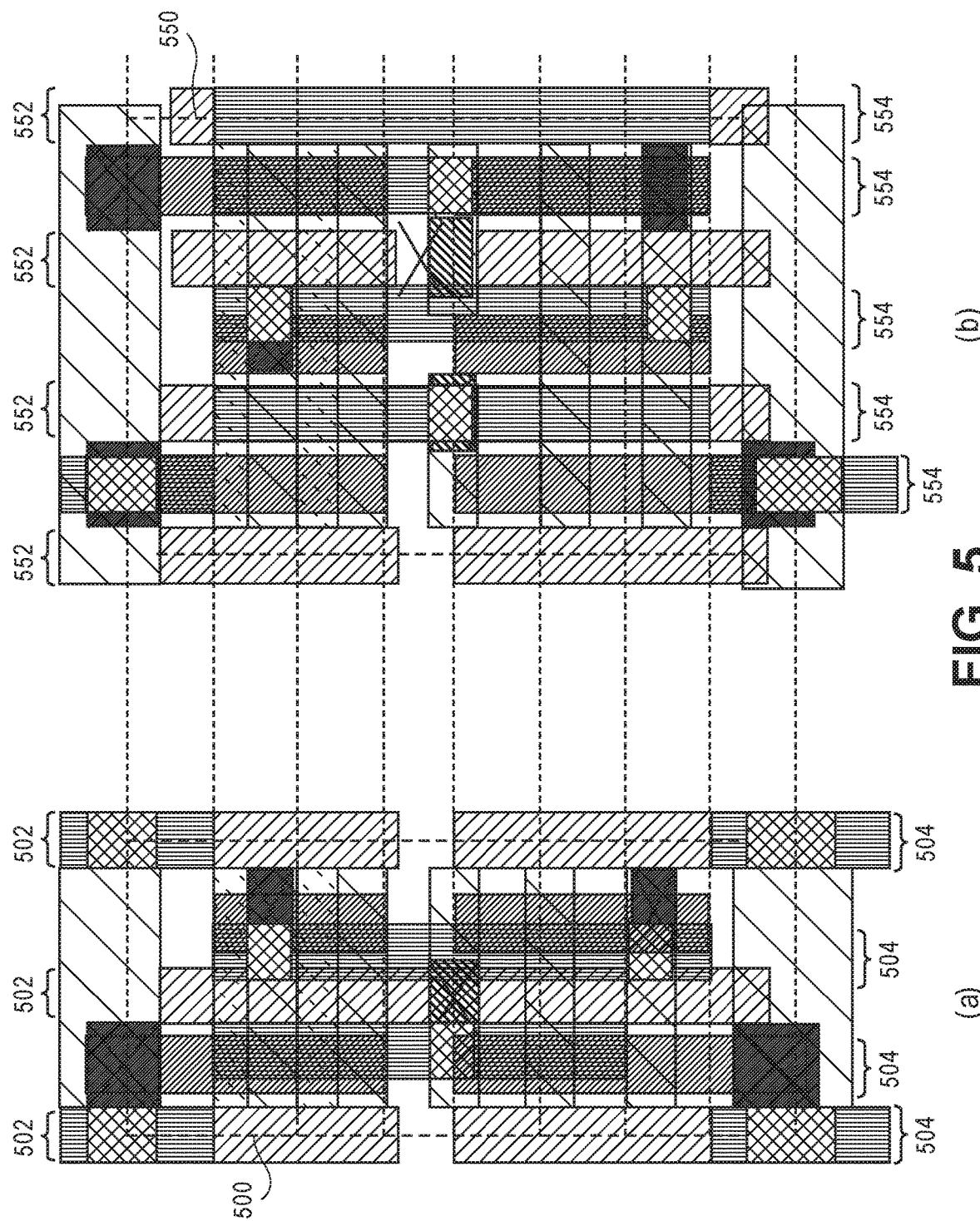
FIG. 5 illustrates plan views of (a) an inverter cell having even poly pitch relative to (b) a NAND cell having odd poly pitch, in accordance with another embodiment of the present disclosure.

As a second standard cell example, FIG. 5 illustrates plan views of (a) an inverter cell having even poly pitch relative to a NAND cell having odd poly pitch, in accordance with another embodiment of the present disclosure. Referring to part (a) of FIG. 5, a cell 500 (dashed box) includes gate lines 502. Metal 1 lines 504 are shown overlying gate lines 502, with one additional M1 line 504 per three gate lines 502. M1 lines are at both the left and right sides of the cell border 500. Referring to part (b) of FIG. 5, a cell 550 (dashed box) includes gate lines 552. Metal 1 lines 554 are shown overlying gate lines 552, with one additional M1 line 554 per four gate lines 552. A M1 line is at the right side of cell border 550, but not at the left side of cell border 550. As a result of the layouts, in a scenario where a first inverter is adjacent a NAND cell 550 which is adjacent a second inverter (as taken from left to right), a dirty registration (DR) occurs between the NAND cell 550 and the first inverter since metal 1 lines may be touching where the NAND cell and the first inverter are abutting to one another.

Figure 6:
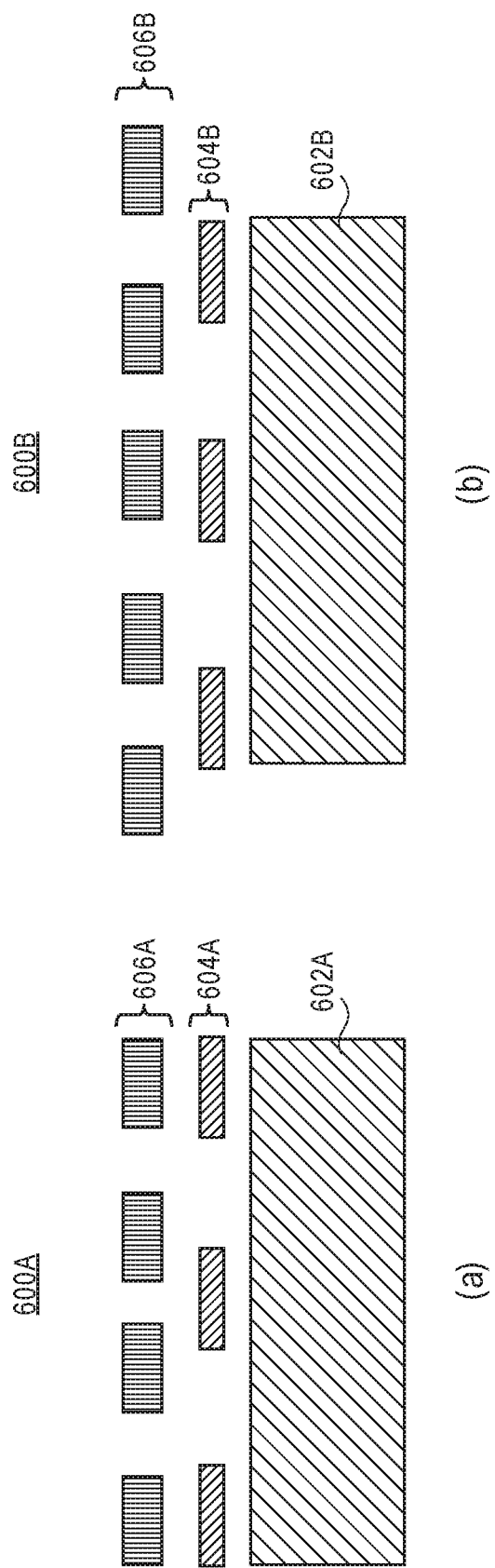
FIG. 6 illustrates cross-sectional views of two different layouts for a same standard cell, in accordance with an embodiment of the present disclosure.

FIG. 6 illustrates cross-sectional views of two different layouts for a same standard cell, in accordance with an embodiment of the present disclosure.

Referring to part (a) of FIG. 6, a set of gate lines 604A overlies a substrate 602A. A set of metal 1 (M1) interconnects 606A overlies the set of gate lines 604A. The set of metal 1 (M1) interconnects 606A has a tighter pitch than the set of gate lines 604A. However, the outermost metal 1 (M1) interconnects 606A have outer alignment with the outermost gate lines 604A. For designation purposes, as used throughout the present disclosure, the aligned arrangement of part (a) of FIG. 6 is referred to as having even (E) alignment.

In contrast to part (a), referring to part (b) of FIG. 6, a set of gate lines 604B overlies a substrate 602B. A set of metal 1 (M1) interconnects 606B overlies the set of gate lines 604B. The set of metal 1 (M1) interconnects 606B has a tighter pitch than the set of gate lines 604B. The outermost metal 1 (M1) interconnects 606B do not have outer alignment with the outermost gate lines 604B. For designation purposes, as used throughout the present disclosure, the non-aligned arrangement of part (b) of FIG. 6 is referred to as having odd (O) alignment.

Figure 7:
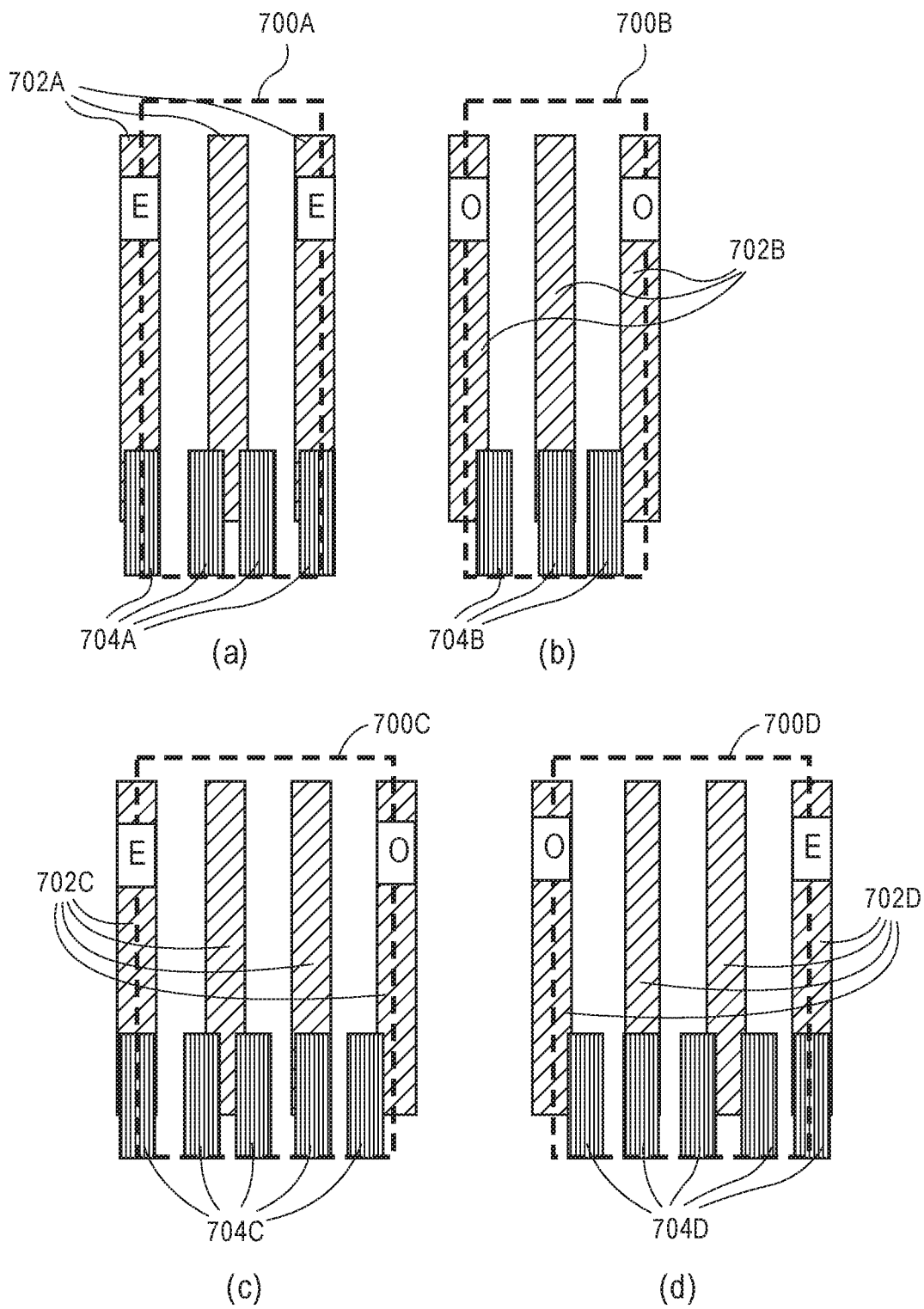
FIG. 7 illustrates plan views of four different cell arrangements indicating the even (E) or odd (O) designation, in accordance with an embodiment of the present disclosure.

FIG. 7 illustrates plan views of four different cell arrangements indicating the even (E) or odd (O) designation, in accordance with an embodiment of the present disclosure.

Referring to part (a) of FIG. 7, a cell 700A has gate (or poly) lines 702A and metal 1 (M1) lines 704A. The cell 700A is designated as an EE cell since the left side of cell 700A and right side of cell 700A have aligned gate 702A and M1 704A lines. By contrast, referring to part (b) of FIG. 7, a cell 700B has gate (or poly) lines 702B and metal 1 (M1) lines 704B. The cell 700B is designated as an OO cell since the left side of cell 700B and right side of cell 700B have non-aligned gate 702B and M1 704B lines.

Referring to part (c) of FIG. 7, a cell 700C has gate (or poly) lines 702C and metal 1 (M1) lines 704C. The cell 700C is designated as an EO cell since the left side of cell 700C has aligned gate 702C and M1 704C lines, but the right side of cell 700C has non-aligned gate 702C and M1 704C lines. By contrast, referring to part (d) of FIG. 7, a cell 700D has gate (or poly) lines 702D and metal 1 (M1) lines 704D. The cell 700D is designated as an OE cell since the left side of cell 700D has non-aligned gate 702D and M1 704D lines, but the right side of cell 700D has aligned gate 702D and M1 704D lines.

Figure 8:
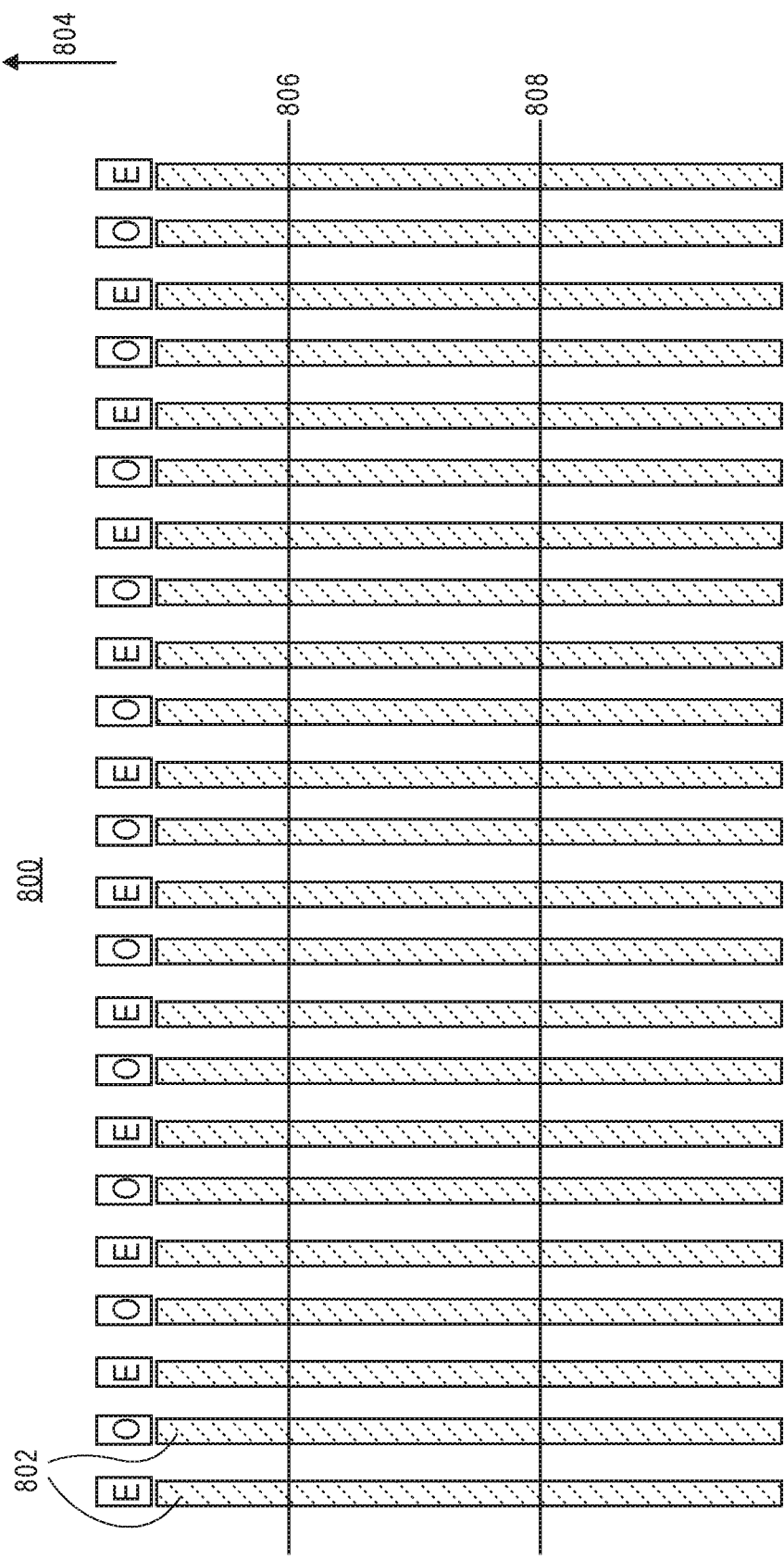
FIG. 8 illustrates a plan view of a block level poly grid, in accordance with an embodiment of the present disclosure.

As a foundation for placing selected first or second versions of standard cell types, FIG. 8 illustrates a plan view of a block level poly grid, in accordance with an embodiment of the present disclosure. Referring to FIG. 8, a block level poly grid 800 includes gate lines 802 running parallel along a direction 804. Designated cell layout borders 806 and 808 are shown running in a second, orthogonal direction. The gate lines 802 alternate between even (E) and odd (O) designation.

Figure 9:
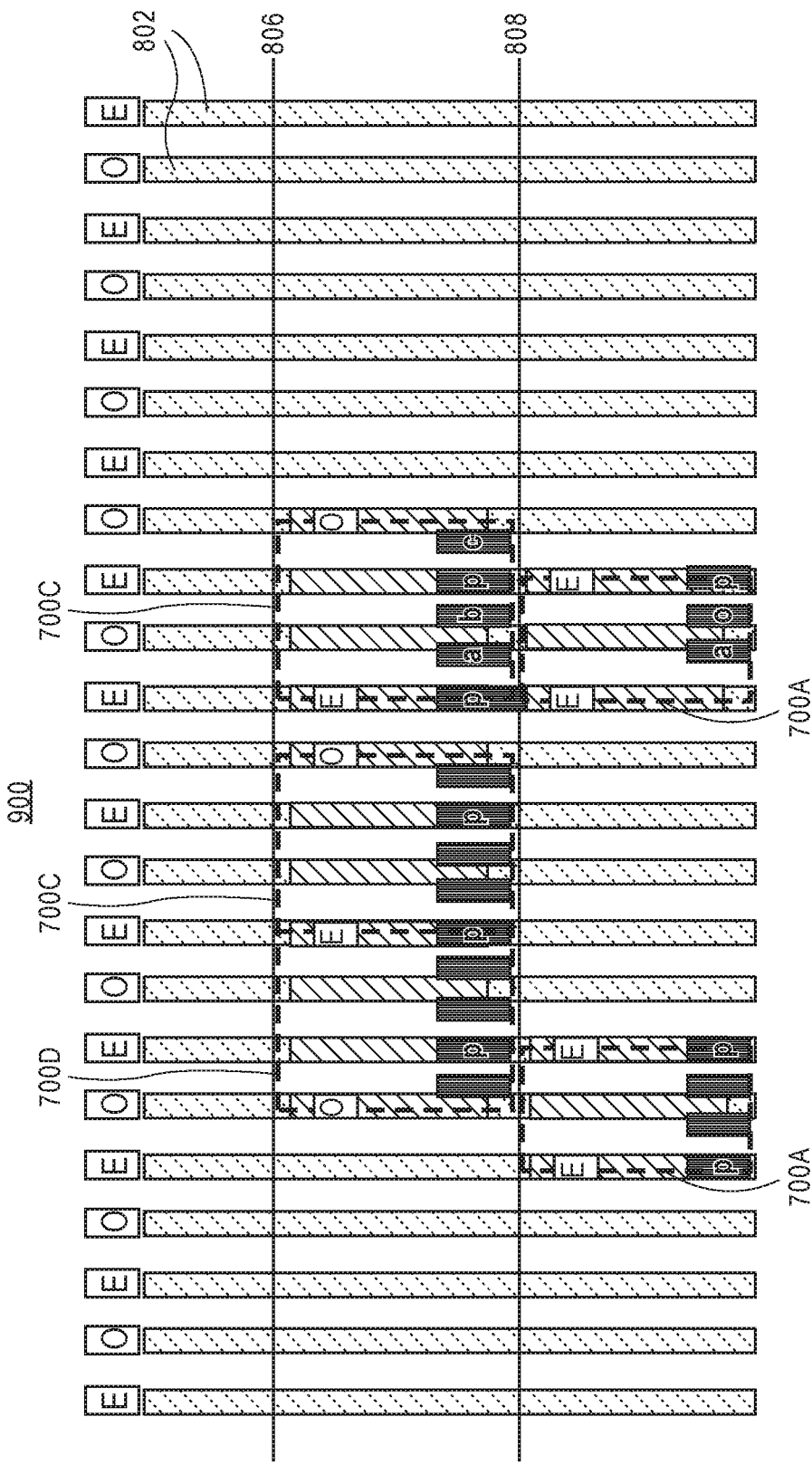
FIG. 9 illustrates an exemplary acceptable (pass) layout based on standard cells having different versions, in accordance with an embodiment of the present disclosure.

FIG. 9 illustrates an exemplary acceptable (pass) layout based on standard cells having different versions, in accordance with an embodiment of the present disclosure. Referring to FIG. 9, a layout 900 includes three cells of the type 700C/700D as placed in order from left to right between borders 806 and 808:700D, abutting first 700C and spaced apart second 700C. The selection between 700C and 700D is based on the alignment of the E or O designations on the corresponding gate lines 802. The layout 900 also includes cells of the type 700A/700B as placed in order from left to right below border 808: first 700A spaced apart from second 700A. The selection between 700A and 700B is based on the alignment of the E or O designations on the corresponding gate lines 802. Layout 900 is a pass cell in the sense that no dirty registration (DR) occurs in the layout 900. It is to be appreciated that p designates power, and a, b, c or o are exemplary pins. In the arrangement 900 the power lines p line up with one another across border 808.

Referring more generally to FIG. 9, in accordance with an embodiment of the present disclosure, an integrated circuit structure includes a plurality of gate lines 802 parallel along a first direction of a substrate and having a pitch along a second direction orthogonal to the first direction. A first version 700C of a cell type is over a first portion of the plurality of gate lines 802. The first version 700C of the cell type includes a first plurality of interconnect lines having a second pitch along the second direction, the second pitch less than the first pitch. A second version 700D of the cell type is over a second portion of the plurality of gate lines 802 laterally adjacent to the first version 700C of the cell type along the second direction. The second version 700D of the cell type includes a second plurality of interconnect lines having the second pitch along the second direction. The second version 700D of the cell type is structurally different than the first version 700C of the cell type.

In an embodiment, individual ones of the first plurality of interconnect lines of the first version 700C of the cell type align with individual ones of the plurality of gate lines 802 along the first direction at a first edge (e.g., left edge) but not at a second edge (e.g., right edge) of the first version 700C of the cell type along the second direction. In one such embodiment, the first version of the cell type 700C is a first version of a NAND cell. Individual ones of the second plurality of interconnect lines of the second version 700D of the cell type do not align with individual ones of the plurality of gate lines 802 along the first direction at a first edge (e.g., left edge) but do align at a second edge (e.g., right edge) of the second version 700D of the cell type along the second direction. In one such embodiment, the second version of the cell type 700D is a second version of a NAND cell.

In another embodiment, the first and second versions are selected from cell types 700A and 700B. Individual ones of the first plurality of interconnect lines of the first version 700A of the cell type align with individual ones of the plurality of gate lines 802 along the first direction at both edges of the first version of the cell type 700A along the second direction. In one embodiment, the first version 700A of the cell type is a first version of an inverter cell. It is to be appreciated that individual ones of the second plurality of interconnect lines of the second version 700B of the cell type would otherwise not align with individual ones of the plurality of gate lines 802 along the first direction at both edges of the second version 700B of the cell type along the second direction. In one embodiment, the second version 700B of the cell type is a second version of an inverter cell.

Figure 10:
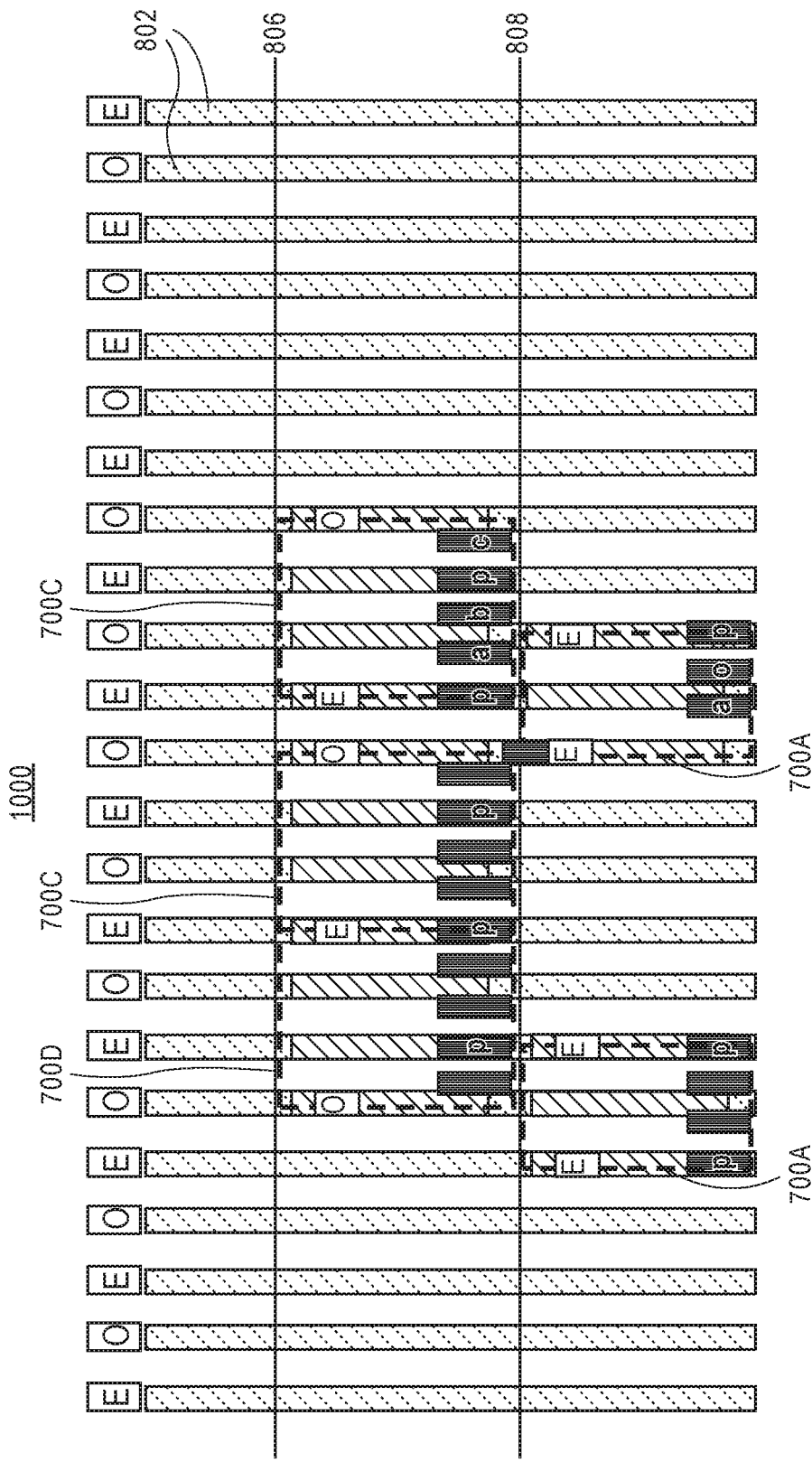
FIG. 10 illustrates an exemplary unacceptable (fail) layout based on standard cells having different versions, in accordance with an embodiment of the present disclosure.

FIG. 10 illustrates an exemplary unacceptable (fail) layout based on standard cells having different versions, in accordance with an embodiment of the present disclosure. Referring to FIG. 10, a layout 1000 includes three cells of the type 700C/700D as placed in order from left to right between borders 806 and 808:700D, abutting first 700C and spaced apart second 700C. The appropriate selection between 700C and 700D is based on the alignment of the E or O designations on the corresponding gate lines 802, as is shown. However, the layout 1000 also includes cells of the type 700A/700B as placed in order from left to right below border 808: first 700A spaced apart from second 700A. The layout 1000 differs from 900 in that the second 700A is moved one line over to the left. Although, the selection between 700A and 700B should be based on the alignment of the E or O designations on the corresponding gate lines 802, it is not, and second cell 700A is misaligned, one consequence of which is misaligned power (p) lines. Layout 1000 is a fail cell since a dirty registration (DR) occurs in the layout 1000.

Figure 11:
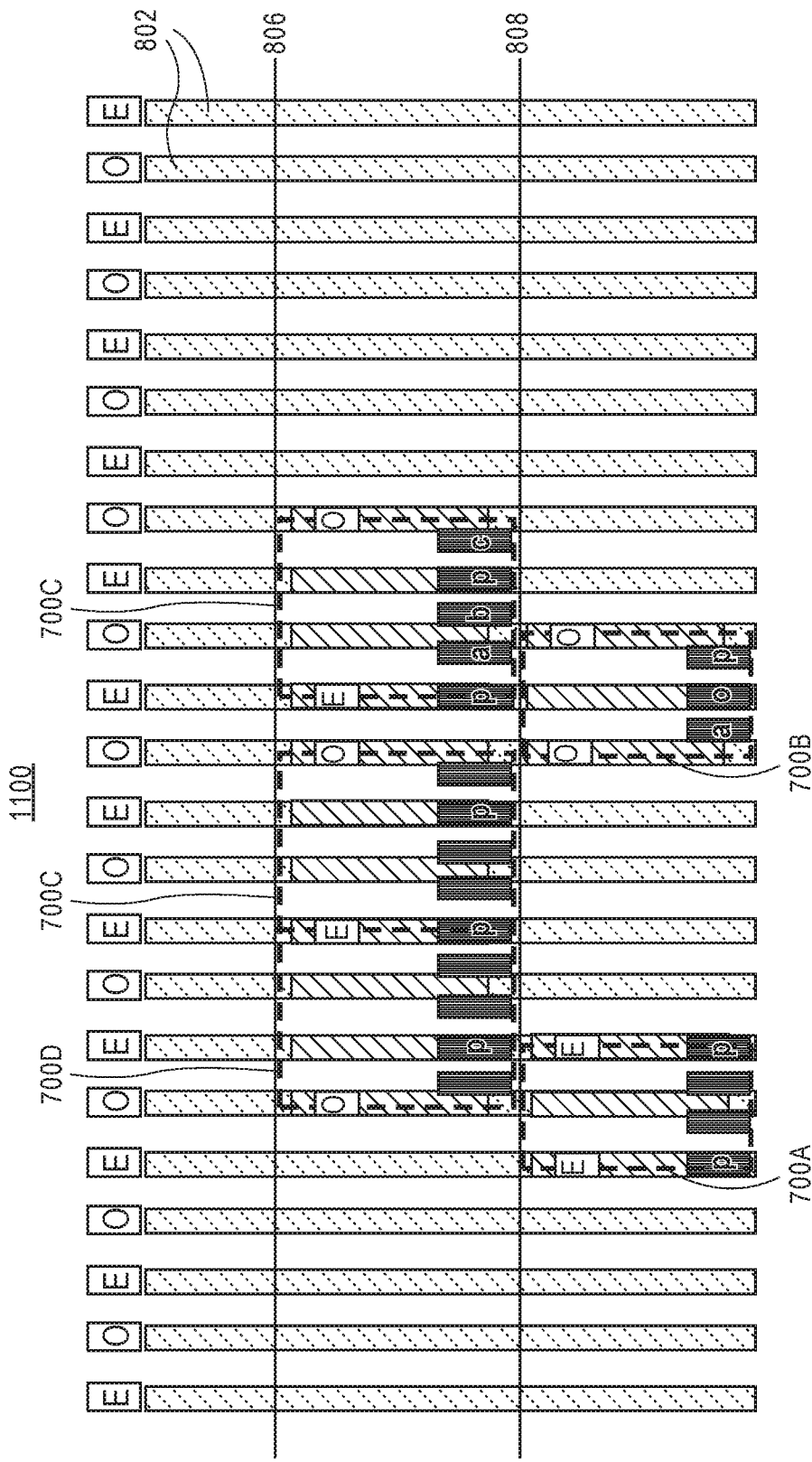
FIG. 11 illustrates another exemplary acceptable (pass) layout based on standard cells having different versions, in accordance with an embodiment of the present disclosure.

FIG. 11 illustrates another exemplary acceptable (pass) layout based on standard cells having different versions, in accordance with an embodiment of the present disclosure. Referring to FIG. 11, a layout 1100 includes three cells of the type 700C/700D as placed in order from left to right between borders 806 and 808:700D, abutting first 700C and spaced apart second 700C. The selection between 700C and 700D is based on the alignment of the E or O designations on the corresponding gate lines 802. The layout 1100 also includes cells of the type 700A/700B as placed in order from left to right below border 808:700A spaced apart from 700B. The position of 700B is the same as the position of 700A in the layout 1000, but the selected cell 700B is based on the appropriate alignment of the O designation on the corresponding gate lines 802. Layout 1100 is a pass cell in the sense that no dirty registration (DR) occurs in the layout 1100. It is to be appreciated that p designates power, and a, b, c or o are exemplary pins. In the arrangement 1100 the power lines p line up with one another across border 808.

Referring collectively to FIGS. 10 and 11, a method of fabricating a layout for an integrated circuit structure includes designating alternating ones of a plurality of gate lines 802 parallel along a first direction as even (E) or odd (O) along a second direction. A location is then selected for a cell type over the plurality of gate lines 802. The method also includes selecting between a first version of the cell type and a second version of the cell type depending on the location, the second version structurally different than the first version, wherein the selected version of the cell type has an even (E) or odd (O) designation for interconnects at edges of the cell type along the second direction, and wherein the designation of the edges of the cell type match with the designation of individual ones of the plurality of gate lines below the interconnects.

In an embodiment, the interconnects have a pitch along the second direction less than a pitch of the gate lines along the second direction. In an embodiment, individual ones of the interconnects of the first version of the cell type align with individual ones of the plurality of gate lines along the first direction at both edges of the first version of the cell type along the second direction. In one such embodiment, individual ones of the interconnects of the second version of the cell type do not align with individual ones of the plurality of gate lines along the first direction at both edges of the second version of the cell type along the second direction. In a particular such embodiment, the cell type is an inverter cell.

In another embodiment, individual ones of the interconnects of the first version of the cell type align with individual ones of the plurality of gate lines along the first direction at a first edge but not at a second edge of the first version of the cell type along the second direction. In one such embodiment, individual ones of the interconnects of the second version of the cell type align with individual ones of the plurality of gate lines along the first direction at a second edge but not at a first edge of the second version of the cell type along the second direction. In a particular embodiment, the cell type is a NAND cell.

Cells and cell versions described herein may be included in a cell library. In an embodiment, a library for a cell layout design includes a first version of a cell type for placement over a first portion of a plurality of gate lines, the first version of the cell type including a first plurality of interconnect lines. The library also includes a second version of the cell type for placement over a second portion of the plurality of gate lines, the second version of the cell type including a second plurality of interconnect lines, the second version of the cell type structurally different than the first version of the cell type.

Figure 12:
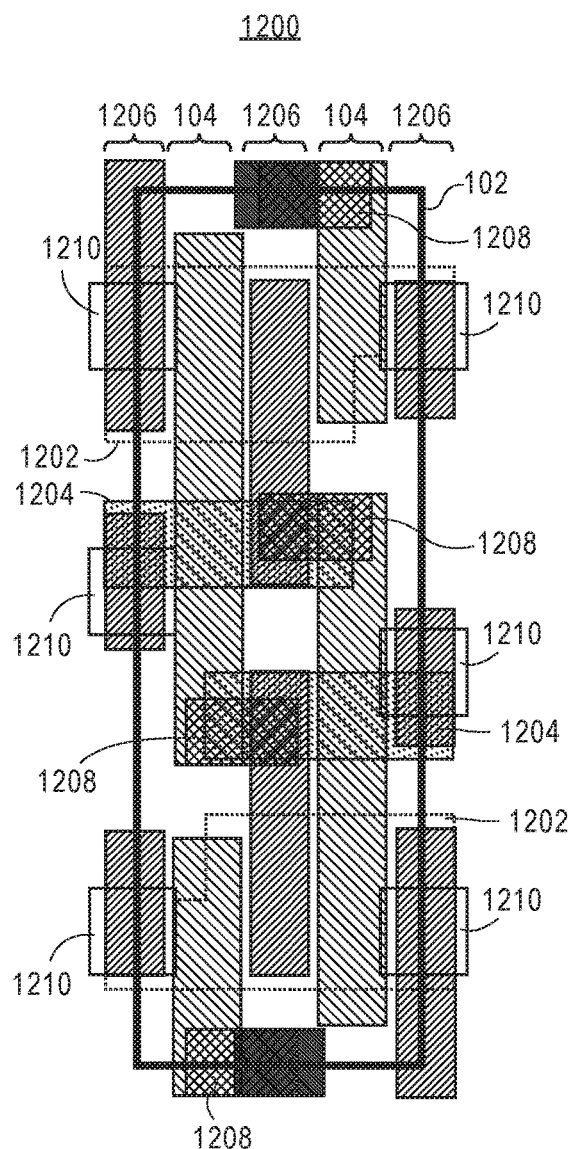
FIG. 12 illustrates a second view of a conventional cell layout for a memory cell.

Continuing the exemplary application of memory cells 100 and 200, as a comparative example, FIG. 12 illustrates a second view of a conventional cell layout 1200 for a memory cell.

Referring to FIG. 12, the 14 nm bit cell 102 is shown with N-diffusion 1202 (e.g., P-type doped active regions, such as boron doped diffusion regions of an underlying substrate) and P-diffusion 1204 (e.g., N-type doped active regions, such as phosphorous and/or arsenic doped diffusion regions of an underlying substrate) with M1 lines removed for clarity. Layout 1200 of bit cell 102 includes gate or poly lines 104, trench contacts 1206, gate contacts 1208 (specific for 14 nm node) and contact vias 1210.

Figure 13:
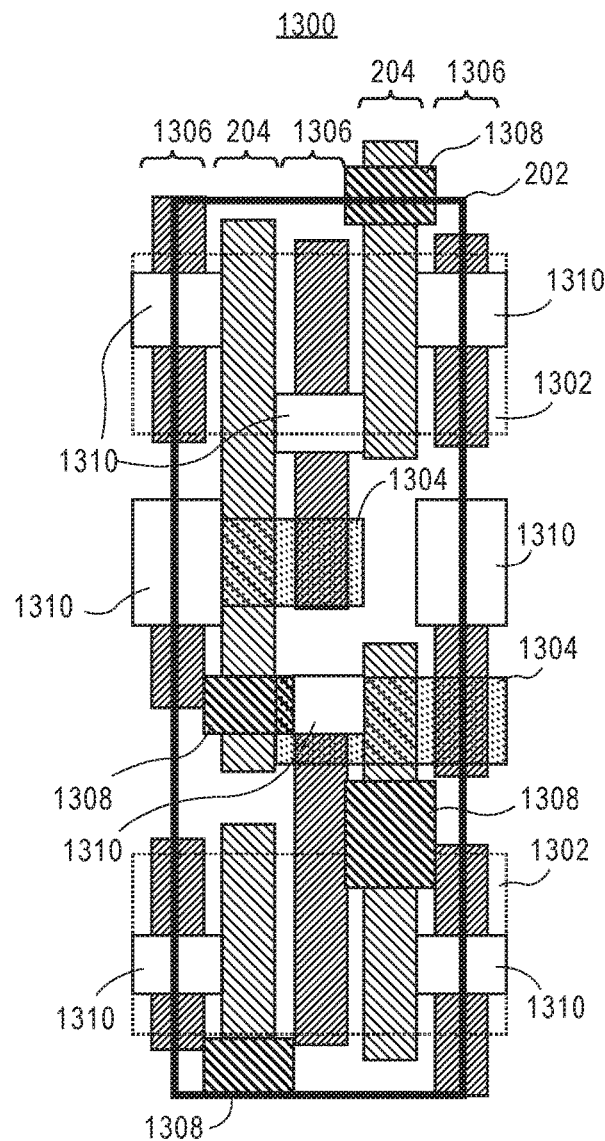
FIG. 13 illustrates a second view of a cell layout for a memory cell having tighter M1 pitch than gate line pitch, in accordance with an embodiment of the present disclosure.

In contrast to FIG. 12, FIG. 13 illustrates a second view of a cell layout 1300 for a memory cell having tighter M1 pitch than gate line pitch, in accordance with an embodiment of the present disclosure.

Referring to FIG. 13, the 10 nm bit cell 202 is shown with N-diffusion 1302 (e.g., P-type doped active regions, such as boron doped diffusion regions of an underlying substrate) and P-diffusion 1304 (e.g., N-type doped active regions, such as phosphorous and/or arsenic doped diffusion regions of an underlying substrate) with M1 lines removed for clarity. Layout 1300 of bit cell 202 includes gate or poly lines 204, trench contacts 1306, gate vias 1308 (specific for 10 nm node) and trench contact vias 1310.

In comparing layouts 1200 and 1300, in accordance with an embodiment of the present disclosure, in the 14 nm layout the internal nodes are connected by a gate contact (GCN) only. An enhanced performance layout cannot be created in the same footprint due to poly to GCN space constraints. In the 10 nm layout, the design allows for landing a contact (VCG) on the gate to eliminate the need for a poly contact. In one embodiment, the arrangement enabled connection of an internal node using M1, allowing for addition active region density (e.g., increased number of fins) within the 14 nm footprint. In the 10 nm layout, upon using a contact over active gate (COAG) architecture, spacing between diffusion regions can be made smaller since they are not limited by trench contact to gate contact spacing. In an embodiment, the layout 1200 of FIG. 12 is referred to as a 112 (1 fin pull-up, 1 fin pass gate, 2 fin pull down) arrangement. By contrast, the layout 1300 of FIG. 13 is referred to as a 122 (1 fin pull-up, 2 fin pass gate, 2 fin pull down) arrangement that, in a particular embodiment, is within the same footprint as the 112 layout of FIG. 12. In an embodiment, the 122 arrangement provides improved performance as compared with the 112 arrangement.

Figures 14, 15:
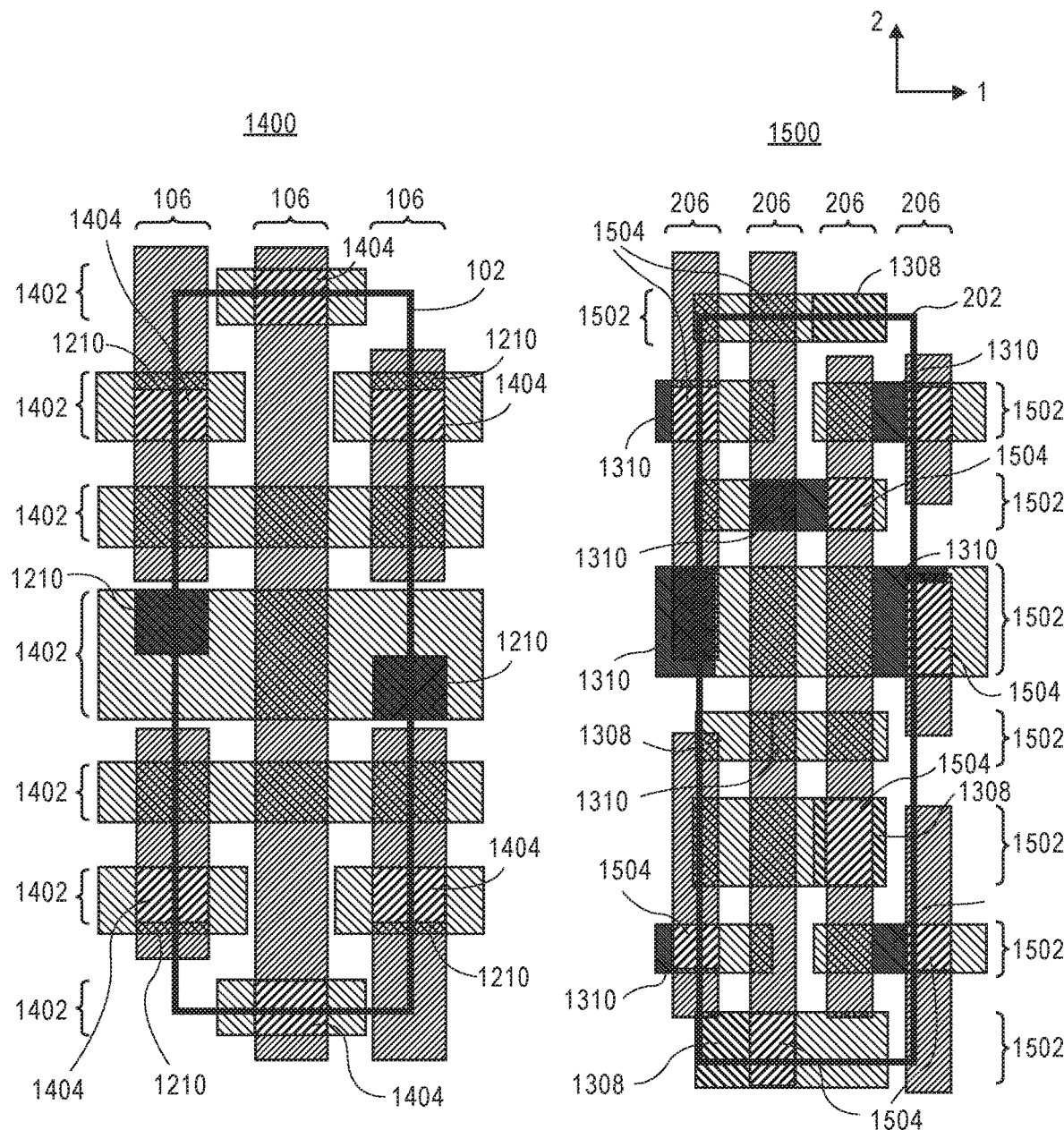
FIG. 14 illustrates a third view of a conventional cell layout for a memory cell.
FIG. 15 illustrates a third view of a cell layout for a memory cell having tighter M1 pitch than gate line pitch, in accordance with an embodiment of the present disclosure.

As a comparative example, FIG. 14 illustrates a third view of a conventional cell layout 1400 for a memory cell.

Referring to FIG. 14, the 14 nm bit cell 102 is shown with metal 0 (M0) lines 1402 with poly lines removed for clarity. Also shown are metal 1 (M1) lines 106, contact vias 1210, via 0 structures 1404.

In contrast to FIG. 14, FIG. 15 illustrates a third view of a cell layout for a memory cell having tighter M1 pitch than gate line pitch, in accordance with an embodiment of the present disclosure.

Referring to FIG. 15, the 10 nm bit cell 202 is shown with metal 0 (M0) lines 1502 with poly lines removed for clarity. Also shown are metal 1 (M1) lines 206, gate vias 1308, trench contact vias 1310, and via 0 structures 1504. In comparing FIGS. 14 and 15, in accordance with an embodiment of the present disclosure, for the 14 nm layout the internal nodes are connected by gate contact (GCN) only, while for the 10 nm layout one of the internal nodes is connected using a free M1 line.

Referring to FIGS. 2, 13 and 15 collectively, in accordance with an embodiment of the present disclosure, an integrated circuit structure includes a memory bit cell 202 on a substrate. The memory bit cell 202 includes first (top 1302), second (top 1304), third (bottom 1304) and fourth (bottom 1302) active regions parallel along a first direction (1) of the substrate. First (left 204) and second (right 204) gate lines are over the first, second, third and fourth active regions 1302/1304. The first and second gate lines 204 are parallel along a second direction (2) of the substrate, the second direction (2) perpendicular to the first direction (1). First (far left 206), second (near left 206) and third (near right 206) interconnect lines are over the first and second gate lines 204. The first, second and third interconnect lines 206 are parallel along the second direction (2) of the substrate.

In an embodiment, the first (far left 206) and second (near left 206) interconnect lines are electrically connected to the first and second gate lines 204 at locations of the first and second gate lines 204 over one or more of the first, second, third and fourth active regions 1302/1304 (e.g., at so-called "active gate" locations). In one embodiment, the first (far left 206) and second (near left 206) interconnect lines are electrically connected to the first and second gate lines 204 by an intervening plurality of interconnect lines 1504 vertically between the first and second interconnect lines 206 and the first and second gate lines 204. The intervening plurality of interconnect lines 1504 is parallel along the first direction (1) of the substrate.

In an embodiment, the third interconnect line (near right 206) electrically couples together a pair of gate electrodes of the memory bit cell 202, the pair of gate electrodes included in the first and second gate lines 204. In another embodiment, the third interconnect line (near right 206) electrically couples together a pair of trench contacts of the memory bit cell 202, the pair of trench contacts included in a plurality of trench contact lines 1306.

In an embodiment, the first active region (top 1302) is a P-type doped active region (e.g., to provide N-diffusion for an NMOS device), the second active region (top 1304) is an N-type doped active region (e.g., to provide P-diffusion for a PMOS device), the third active region (bottom 1304) is an N-type doped active region (e.g., to provide P-diffusion for a PMOS device), and the fourth active region (bottom 1302) is an N-type doped active region (e.g., to provide N-diffusion for an NMOS device). In an embodiment, the first, second, third and fourth active regions 1302/1304 are in silicon fins. In an embodiment, the memory bit cell 202 includes a pull-up transistor based on a single silicon fin, a pass-gate transistor based on two silicon fins, and a pull-down transistor based on two silicon fins.

In an embodiment, the first and second gate lines 204 alternate with individual ones of a plurality of trench contact lines 1306 parallel along the second direction (2) of the substrate. The plurality of trench contact lines 1306 includes trench contacts of the memory bit cell 202. The first and second gate lines 204 include gate electrode of the memory bit cell 202.

In an embodiment, the first and second gate lines 204 have a first pitch along the first direction (1). The first, second and third interconnect lines 206 have a second pitch along the first direction (2). In one such embodiment, the second pitch is less than the first pitch. In a specific such embodiment, the first pitch is in the range of 50 nanometers to 60 nanometers, and the second pitch is in the range of 30 nanometers to 40 nanometers. In a particular such embodiment, the first pitch is 54 nanometers, and the second pitch is 36 nanometers.

In an embodiment, layouts described herein are compatible with uniform plug and mask patterns, including a uniform fin trim mask. Layouts may be compatible with non-EUV processes. Additionally, layouts may only require use of a middle-fin trim mask. Embodiments described herein may enable increased density in terms of area compared to conventional layouts. Embodiments may be implemented to provide a layout-efficient memory implementation in advanced self-aligned process technologies. Advantages may be realized in terms of die area and/or memory performance. Circuit techniques may be uniquely enabled by such layout approaches.

Figure 16A:
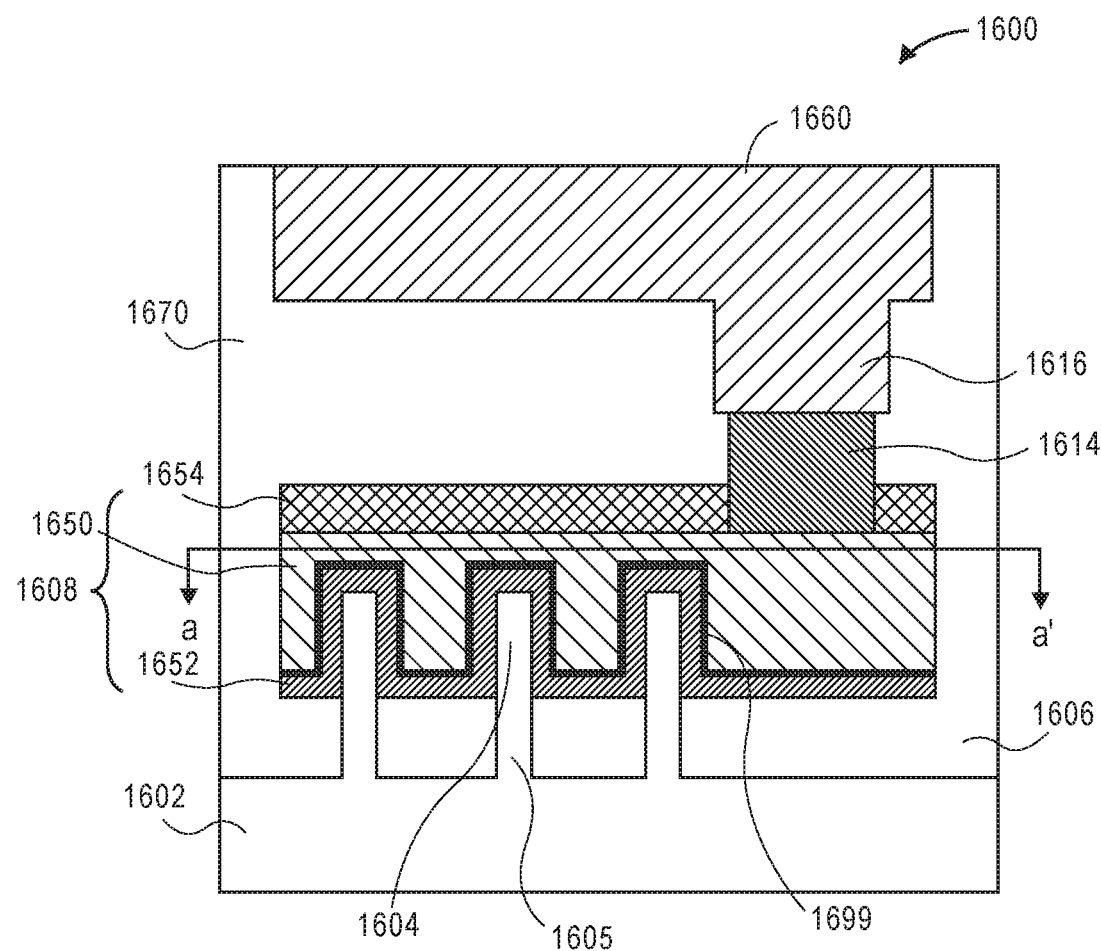
FIG. 16A illustrates a cross-sectional view of a non-planar semiconductor device, in accordance with an embodiment of the present disclosure.
Figure 16B:
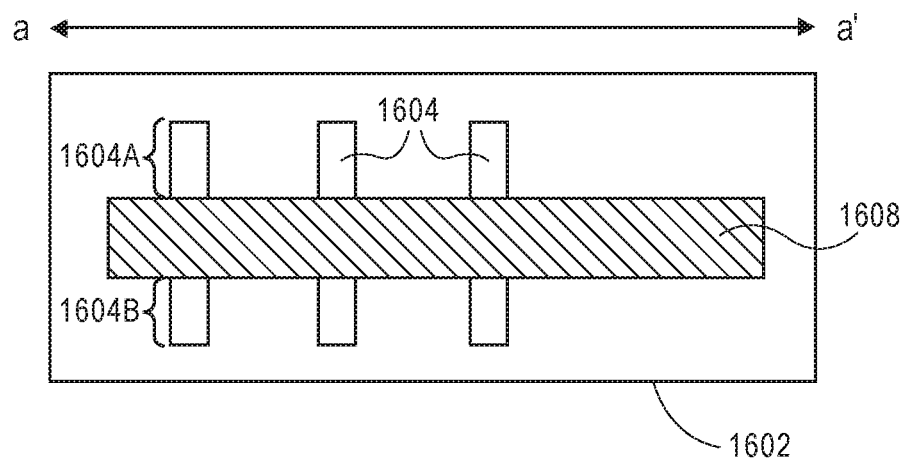
FIG. 16B illustrates a plan view taken along the a-a' axis of the semiconductor device of FIG. 16A, in accordance with an embodiment of the present disclosure.

One or more embodiments described herein are directed to the integration of semiconductor devices, such as metal oxide semiconductor (MOS) device integration. As an example, FIG. 16A illustrates a cross-sectional view of a non-planar semiconductor device, in accordance with an embodiment of the present disclosure. FIG. 16B illustrates a plan view taken along the a-a' axis of the semiconductor device of FIG. 16A, in accordance with an embodiment of the present disclosure.

Referring to FIG. 16A, a semiconductor structure or device 1600 includes a non-planar active region (e.g., a fin structure including protruding fin portion 1604 and sub-fin region 1605) formed from substrate 1602, and within isolation region 1606. A gate line 1608 is disposed over the protruding portions 1604 of the non-planar active region as well as over a portion of the isolation region 1606. As shown, gate line 1608 includes a gate electrode 1650/1699 and a gate dielectric layer 1652. In one embodiment, gate line 1608 may also include a dielectric cap layer 1654. A gate contact 1614, and overlying gate contact via 1616 are also seen from this perspective, along with an overlying metal interconnect 1660, all of which are disposed in inter-layer dielectric stacks or layers 1670.

Also seen from the perspective of FIG. 16A, the gate contact 1614 is, in one embodiment, disposed over isolation region 1606, but not over the non-planar active regions. However, the arrangement of semiconductor structure or device 1600 places the gate contact over isolation regions. Such an arrangement may, for certain technology nodes be viewed as inefficient use of layout space in certain applications or may be limiting for cell design. In another embodiment, a semiconductor device has contact structures that contact portions of a gate electrode formed over an active region to provide a contact-over-active-gate (COAG) architecture.

It is to be appreciated that, for convenience of illustration, the gate line 1608 is shown over three protruding fin portions 1604, but is not limited as such. For example, a gate line can instead be formed over 1, 2, 4 or even more protruding fin portions. As is applicable throughout the present disclosure, the protruding fin portions 1604 may be referred to as forming a grating structure. In an embodiment, the term "grating" for protruding fin portions 1604 is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have protruding fin portions 1604 spaced at a constant pitch and having a constant width. The pattern may be fabricated by a pitch halving or pitch quartering, or other pitch division, approach.

Referring to FIG. 16B, the gate line 1608 is shown as disposed over the protruding fin portions 1604. Source and drain regions 1604A and 1604B of the protruding fin portions 1604 can be seen from this perspective. In one embodiment, the source and drain regions 1604A and 1604B are doped portions of original material of the protruding fin portions 1604. In another embodiment, the material of the protruding fin portions 1604 is removed and replaced with another semiconductor material, e.g., by epitaxial deposition. In either case, the source and drain regions 1604A and 1604B may extend below the height of dielectric layer 1606, i.e., into the sub-fin region 1605.

In an embodiment, the semiconductor structure or device 1600 is a non-planar device such as, but not limited to, a fin-FET or a tri-gate device. In such an embodiment, a corresponding semiconducting channel region is composed of or is formed in a three-dimensional body. In one such embodiment, the gate electrode and gate electrode materials of gate lines 1608 surround at least a top surface and a pair of sidewalls of the three-dimensional body.

Substrate 1602 may be composed of a semiconductor material that can withstand a manufacturing process and in which charge can migrate. In an embodiment, substrate 1602 is a bulk substrate composed of a crystalline silicon, silicon/germanium or germanium layer doped with a charge carrier, such as but not limited to phosphorus, arsenic, antimony, boron, gallium or a combination thereof, to form active region 1604. In one embodiment, the concentration of silicon atoms in bulk substrate 1602 is greater than 97%. In another embodiment, bulk substrate 1602 is composed of an epitaxial layer grown atop a distinct crystalline substrate, e.g. a silicon epitaxial layer grown atop a boron-doped bulk silicon mono-crystalline substrate. Bulk substrate 1602 may alternatively be composed of a group III-V material. In an embodiment, bulk substrate 1602 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 1602 is composed of a III-V material and the charge-carrier dopant impurity atoms are ones such as, but not limited to, magnesium, beryllium, zinc, carbon, silicon, germanium, oxygen, sulfur, selenium or tellurium.

Isolation region 1606 may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the isolation region 1606 is composed of a dielectric material such as, but not limited to, silicon dioxide, silicon oxy-nitride, silicon nitride, or carbon-doped silicon nitride.

In an embodiment, the gate dielectric layer 1652 is composed of a high-K material. For example, in one embodiment, the gate dielectric layer 1652 is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate 1602. In an embodiment, the gate dielectric layer is composed of a top high-k portion and a lower portion composed of an oxide of a semiconductor material. In one embodiment, the gate dielectric layer 1652 is composed of a top portion of hafnium oxide and a bottom portion of silicon dioxide or silicon oxy-nitride.

In an embodiment, layer 1650 of the gate electrode 1650/1699 is composed of a non-workfunction-setting conductive fill material formed above a workfunction-setting layer 1699. In a particular embodiment, the transistor 1600 is an N-type (NMOS) transistor, and the workfunction-setting layer 1699 is an N-type workfunction. In another particular embodiment, the transistor 1600 is a P-type (PMOS) transistor, and the workfunction-setting layer 1699 has a P-type workfunction.

In one such embodiment, the conductive fill material 1650 includes a material such as but not limited to, tungsten (W), aluminum (Al), or copper (Cu). In one embodiment, one or more conductive barrier layers (such as titanium nitride or tantalum nitride) is between layers 1650 and 1699 of the gate electrode. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In an embodiment, the dielectric cap layer 1654 and/or dielectric spacers associated with the gate electrode stacks may be composed of a material suitable to ultimately electrically isolate, or contribute to the isolation of, a permanent gate structure from adjacent or overlying conductive contacts, such as self-aligned contacts. For example, in one embodiment, the dielectric cap layer 1654 and/or dielectric spacers are composed of a dielectric material such as, but not limited to, silicon dioxide, silicon oxy-nitride, silicon nitride, or carbon-doped silicon nitride.

Gate contact 1614, overlying gate contact via 1616, and/or overlying metal interconnect 1660 may be composed of a conductive material. In an embodiment, one or more of the contacts, interconnects or vias are composed of a metal species. The metal species may be a pure metal, such as tungsten, nickel, or cobalt, or may be an alloy such as a metal-metal alloy or a metal-semiconductor alloy (e.g., such as a silicide material). In a particular embodiment, one or more of gate contact 1614, overlying gate contact via 1616, or overlying metal interconnect 1660 includes a barrier layer and a conductive fill material. In one such embodiment, the barrier layer is composed of titanium and/or titanium nitride or tantalum and/or tantalum nitride. In an embodiment, the conductive fill material is composed of a conductive material such as, but not limited to, Cu, Al, Ti, Zr, Hf, V, Ru, Co, Ni, Pd, Pt, W, Ag, Au or alloys thereof. In general, as used throughout the present disclosure, interconnect lines are also sometimes referred to in the art as traces, wires, lines, metal lines, or simply interconnects.

In an embodiment, inter-layer dielectric stacks or layers 1670 are composed of or includes a layer of a dielectric or insulating material. Examples of suitable dielectric materials include, but are not limited to, oxides of silicon (e.g., silicon dioxide (SiO2)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment (although not shown), providing structure 1600 involves formation of a contact pattern which is essentially perfectly aligned to an existing gate pattern while eliminating the use of a lithographic step with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate stack structure 1608 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of SF6. In another embodiment, dummy gates are composed of polycrystalline silicon or amorphous silicon and are removed with a wet etch process including use of aqueous NH4OH or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure 1600. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

In an embodiment, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

In a particular embodiment, each of the trench contacts includes a barrier layer and a conductive fill material. In one such embodiment, the barrier layer is composed of titanium and/or titanium nitride or tantalum and/or tantalum nitride. In an embodiment, the conductive fill material is composed of a conductive material such as, but not limited to, Cu, Al, Ti, Zr, Hf, V, Ru, Co, Ni, Pd, Pt, W, Ag, Au or alloys thereof.

It is to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, or a FIN-FET. One or more embodiments may be particularly useful for fabricating semiconductor devices at a 10 nanometer (10 nm) or smaller technology node.

In an embodiment, as is also used throughout the present description, lithographic operations are performed using 193 nm immersion lithography (i193), extreme ultra-violet (EUV) and/or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 17:
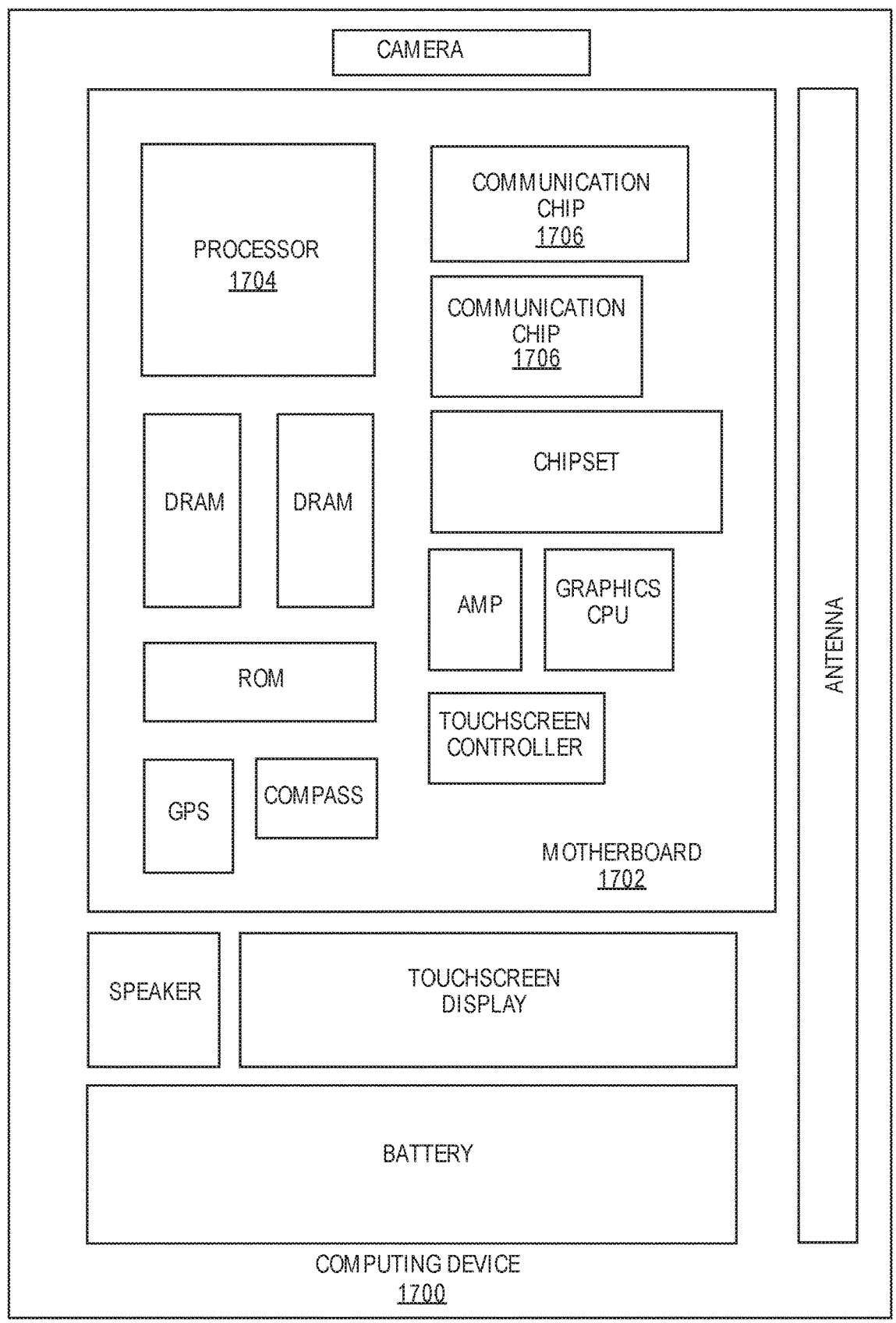
FIG. 17 illustrates a computing device in accordance with one implementation of an embodiment of the disclosure.

FIG. 17 illustrates a computing device 1700 in accordance with one implementation of the disclosure. The computing device 1700 houses a board 1702. The board 1702 may include a number of components, including but not limited to a processor 1704 and at least one communication chip 1706. The processor 1704 is physically and electrically coupled to the board 1702. In some implementations the at least one communication chip 1706 is also physically and electrically coupled to the board 1702. In further implementations, the communication chip 1706 is part of the processor 1704.

Depending on its applications, computing device 1700 may include other components that may or may not be physically and electrically coupled to the board 1702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1706 enables wireless communications for the transfer of data to and from the computing device 1700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1700 may include a plurality of communication chips 1706. For instance, a first communication chip 1706 may be dedicated to shorter range wireless communications such as Wi-Fi and Bluetooth and a second communication chip 1706 may be dedicated to longer range wireless communications such as GPS, EDGE, GPRS, CDMA, WiMAX, LTE, Ev-DO, and others.

The processor 1704 of the computing device 1700 includes an integrated circuit die packaged within the processor 1704. In some implementations of the disclosure, the integrated circuit die of the processor includes a cell layout having two versions of a standard cell, e.g., as provided by a metal line pattern having a tighter pitch than an underlying gate line pattern, in accordance with implementations of embodiments of the disclosure. The term "processor" may refer to any device or portion of a device that processes electronic data from registers and/or memory to transform that electronic data into other electronic data that may be stored in registers and/or memory.

The communication chip 1706 also includes an integrated circuit die packaged within the communication chip 1706. In accordance with another implementation of embodiments of the disclosure, the integrated circuit die of the communication chip includes a cell layout having two versions of a standard cell, e.g., as provided by a metal line pattern having a tighter pitch than an underlying gate line pattern, in accordance with implementations of embodiments of the disclosure.

In further implementations, another component housed within the computing device 1700 may contain an integrated circuit die that includes a cell layout having two versions of a standard cell, e.g., as provided by a metal line pattern having a tighter pitch than an underlying gate line pattern, in accordance with implementations of embodiments of the disclosure.

In various implementations, the computing device 1700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1700 may be any other electronic device that processes data.

Figure 18:
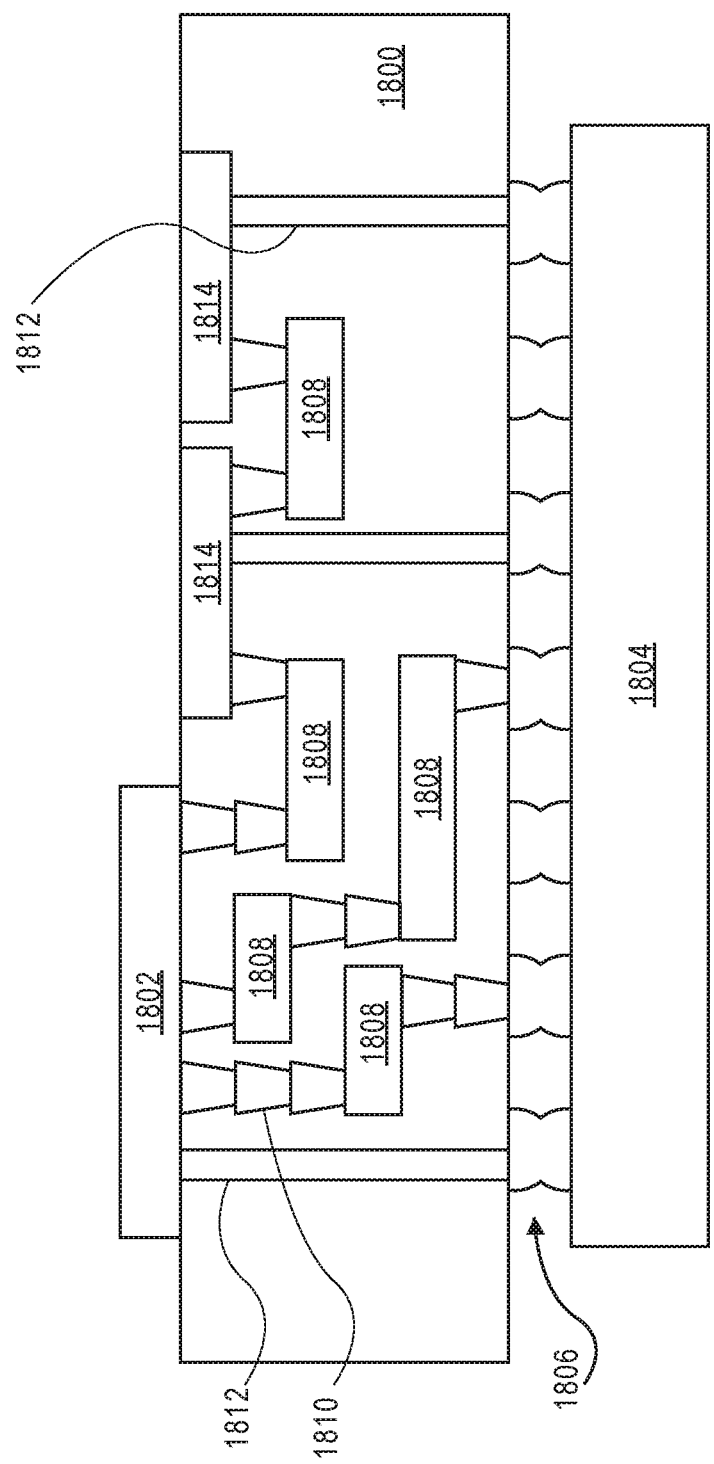
FIG. 18 is an interposer implementing one or more embodiments of the disclosure.

FIG. 18 illustrates an interposer 1800 that includes one or more embodiments of the disclosure. The interposer 1800 is an intervening substrate used to bridge a first substrate 1802 to a second substrate 1804. The first substrate 1802 may be, for instance, an integrated circuit die. The second substrate 1804 may be, for instance, a memory module, a computer motherboard, or another integrated circuit die. Generally, the purpose of an interposer 1800 is to spread a connection to a wider pitch or to reroute a connection to a different connection. For example, an interposer 1800 may couple an integrated circuit die to a ball grid array (BGA) 1806 that can subsequently be coupled to the second substrate 1804. In some embodiments, the first and second substrates 1802/1804 are attached to opposing sides of the interposer 1800. In other embodiments, the first and second substrates 1802/1804 are attached to the same side of the interposer 1800. And in further embodiments, three or more substrates are interconnected by way of the interposer 1800.

The interposer 1800 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1808 and vias 1810, including but not limited to through-silicon vias (TSVs) 1812. The interposer 1800 may further include embedded devices 1814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1800. In accordance with embodiments of the disclosure, apparatuses or processes disclosed herein may be used in the fabrication of interposer 1800. In one such embodiment, one or more of the components of the interposer 1800 include a cell layout having two versions of a standard cell, e.g., as provided by a metal line pattern having a tighter pitch than an underlying gate line pattern.

Thus, embodiments described herein include multi version library cell handling and integrated circuit structures fabricated therefrom.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example Embodiment 1

An integrated circuit structure includes a plurality of gate lines parallel along a first direction of a substrate and having a pitch along a second direction orthogonal to the first direction. A first version of a cell type is over a first portion of the plurality of gate lines, the first version of the cell type including a first plurality of interconnect lines having a second pitch along the second direction, the second pitch less than the first pitch. A second version of the cell type is over a second portion of the plurality of gate lines laterally adjacent to the first version of the cell type along the second direction, the second version of the cell type including a second plurality of interconnect lines having the second pitch along the second direction, and the second version of the cell type structurally different than the first version of the cell type.

Example Embodiment 2

The integrated circuit structure of example embodiment 1, wherein individual ones of the first plurality of interconnect lines of the first version of the cell type align with individual ones of the plurality of gate lines along the first direction at both edges of the first version of the cell type along the second direction.

Example Embodiment 3

The integrated circuit structure of example embodiment 1 or 2, wherein the first version of the cell type is a first version of an inverter cell.

Example Embodiment 4

The integrated circuit structure of example embodiment 1, wherein individual ones of the second plurality of interconnect lines of the second version of the cell type do not align with individual ones of the plurality of gate lines along the first direction at both edges of the second version of the cell type along the second direction.

Example Embodiment 5

The integrated circuit structure of example embodiment 1 or 4, wherein the second version of the cell type is a second version of an inverter cell.

Example Embodiment 6

The integrated circuit structure of example embodiment 1, wherein individual ones of the first plurality of interconnect lines of the first version of the cell type align with individual ones of the plurality of gate lines along the first direction at a first edge but not at a second edge of the first version of the cell type along the second direction.

Example Embodiment 7

The integrated circuit structure of example embodiment 1 or 6, wherein the first version of the cell type is a first version of a NAND cell.

Example Embodiment 8

A method of fabricating a layout for an integrated circuit structure includes designating alternating ones of a plurality of gate lines parallel along a first direction as even (E) or odd (O) along a second direction. A location is then selected for a cell type over the plurality of gate lines. The method also includes selecting between a first version of the cell type and a second version of the cell type depending on the location, the second version structurally different than the first version, wherein the selected version of the cell type has an even (E) or odd (O) designation for interconnects at edges of the cell type along the second direction, and wherein the designation of the edges of the cell type match with the designation of individual ones of the plurality of gate lines below the interconnects.

Example Embodiment 9

The method of example embodiment 8, wherein the interconnects have a pitch along the second direction less than a pitch of the gate lines along the second direction.

Example Embodiment 10

The method of example embodiment 8 or 9, wherein individual ones of the interconnects of the first version of the cell type align with individual ones of the plurality of gate lines along the first direction at both edges of the first version of the cell type along the second direction.

Example Embodiment 11

The method of example embodiment 8, 9 or 10, wherein individual ones of the interconnects of the second version of the cell type do not align with individual ones of the plurality of gate lines along the first direction at both edges of the second version of the cell type along the second direction.

Example Embodiment 12

The method of example embodiment 8, 9, 10 or 11, wherein the cell type is an inverter cell.

Example Embodiment 13

The method of example embodiment 8 or 9, wherein individual ones of the interconnects of the first version of the cell type align with individual ones of the plurality of gate lines along the first direction at a first edge but not at a second edge of the first version of the cell type along the second direction.

Example Embodiment 14

The method of example embodiment 8, 9 or 13, wherein individual ones of the interconnects of the second version of the cell type align with individual ones of the plurality of gate lines along the first direction at a second edge but not at a first edge of the second version of the cell type along the second direction.

Example Embodiment 15

The method of example embodiment 8, 9, 13 or 14, wherein the cell type is a NAND cell.

Example Embodiment 16

A library for a cell layout design includes a first version of a cell type for placement over a first portion of a plurality of gate lines, the first version of the cell type including a first plurality of interconnect lines. The library also includes a second version of the cell type for placement over a second portion of the plurality of gate lines, the second version of the cell type including a second plurality of interconnect lines, the second version of the cell type structurally different than the first version of the cell type.

Example Embodiment 17

The library for the cell layout design of example embodiment 16, wherein individual ones of the first plurality of interconnect lines of the first version of the cell type align with individual ones of the plurality of gate lines along the first direction at both edges of the first version of the cell type along the second direction.

Example Embodiment 18

The library for the cell layout design of example embodiment 16 or 17, wherein individual ones of the second plurality of interconnect lines of the second version of the cell type do not align with individual ones of the plurality of gate lines along the first direction at both edges of the second version of the cell type along the second direction.

Example Embodiment 19

The library for the cell layout design of example embodiment 16, wherein individual ones of the interconnects of the first version of the cell type align with individual ones of the plurality of gate lines along the first direction at a first edge but not at a second edge of the first version of the cell type along the second direction.

Example Embodiment 20

The library for the cell layout design of example embodiment 16 or 19, wherein individual ones of the interconnects of the second version of the cell type align with individual ones of the plurality of gate lines along the first direction at a second edge but not at a first edge of the second version of the cell type along the second direction.

What is claimed is:

1. An integrated circuit structure, comprising:
   a plurality of gate lines parallel along a first direction of a substrate and having a pitch along a second direction orthogonal to the first direction;
   a first version of a cell type over a first portion of the plurality of gate lines, the first version of the cell type comprising a first plurality of interconnect lines having a second pitch along the second direction, the second pitch less than the first pitch; and
   a second version of the cell type over a second portion of the plurality of gate lines laterally adjacent to the first version of the cell type along the second direction, the second version of the cell type comprising a second plurality of interconnect lines having the second pitch along the second direction, and the second version of the cell type structurally different than the first version of the cell type.

2. The integrated circuit structure of claim 1, wherein individual ones of the first plurality of interconnect lines of the first version of the cell type align with individual ones of the plurality of gate lines along the first direction at both edges of the first version of the cell type along the second direction.

3. The integrated circuit structure of claim 2, wherein the first version of the cell type is a first version of an inverter cell.

4. The integrated circuit structure of claim 1, wherein individual ones of the second plurality of interconnect lines of the second version of the cell type do not align with individual ones of the plurality of gate lines along the first direction at both edges of the second version of the cell type along the second direction.

5. The integrated circuit structure of claim 4, wherein the second version of the cell type is a second version of an inverter cell.

6. The integrated circuit structure of claim 1, wherein individual ones of the first plurality of interconnect lines of the first version of the cell type align with individual ones of the plurality of gate lines along the first direction at a first edge but not at a second edge of the first version of the cell type along the second direction.

7. The integrated circuit structure of claim 6, wherein the first version of the cell type is a first version of a NAND cell.

* * * * *